United States Patent
Hilali et al.

(10) Patent No.: US 11,855,233 B2
(45) Date of Patent: Dec. 26, 2023

(54) VANADIUM-CONTAINING ELECTRODES AND INTERCONNECTS TO TRANSPARENT CONDUCTORS

(71) Applicant: PHAROS MATERIALS, INC., Fremont, CA (US)

(72) Inventors: Mohamed M. Hilali, San Ramon, CA (US); Yaping Zhang, Fremont, CA (US); Jifeng Wei, Fremont, CA (US); Zhiyong Li, Los Altos, CA (US); Xiangling Xu, Fremont, CA (US)

(73) Assignee: PHAROS MATERIALS, INC., Fremont, CA (US)

( * ) Notice: Subject to any disclaimer, the term of this patent is extended or adjusted under 35 U.S.C. 154(b) by 0 days.

(21) Appl. No.: 17/680,051

(22) Filed: Feb. 24, 2022

(65) Prior Publication Data
US 2022/0181506 A1    Jun. 9, 2022

Related U.S. Application Data

(63) Continuation of application No. 17/323,672, filed on May 18, 2021, now Pat. No. 11,296,242, which is a continuation-in-part of application No. 16/906,532, filed on Jun. 19, 2020, now Pat. No. 11,075,308.

(51) Int. Cl.
*H01L 31/0224* (2006.01)
*H01L 31/0216* (2014.01)
*H01L 33/42* (2010.01)
*H01L 31/18* (2006.01)

(52) U.S. Cl.
CPC ........... *H01L 31/022425* (2013.01); *H01L 31/02168* (2013.01); *H01L 31/022466* (2013.01); *H01L 31/1884* (2013.01); *H01L 33/42* (2013.01)

(58) Field of Classification Search
CPC ... H01L 31/02168; H01L 31/022466–022483; H01L 31/022425; H01L 31/022441–022458; H01L 31/0682; H01L 31/062; H01L 31/0224–022491
See application file for complete search history.

(56) References Cited

U.S. PATENT DOCUMENTS

| | | |
|---|---|---|
| 5,663,109 A | 9/1997 | Dietz et al. |
| 10,252,938 B2 | 4/2019 | Sawai et al. |
| 2008/0173347 A1 | 7/2008 | Korevaar et al. |
| 2010/0126549 A1 | 5/2010 | Ryu |
| 2011/0272024 A1 | 11/2011 | Choi et al. |
| 2013/0244115 A1 | 9/2013 | Cao et al. |
| 2013/0298973 A1 | 11/2013 | Xie et al. |
| 2014/0038346 A1 | 2/2014 | Hang et al. |
| 2014/0053900 A1 | 2/2014 | Komori et al. |
| 2014/0145122 A1 | 5/2014 | Sawai et al. |

(Continued)

FOREIGN PATENT DOCUMENTS

| | | |
|---|---|---|
| CN | 107393974 A | 11/2017 |
| EP | 3486953 A1 | 5/2019 |
| JP | 2011-146190 A | 7/2011 |

OTHER PUBLICATIONS

International Search Report and Written Opinion for Application No. PCT/US2021/036721, dated Sep. 6, 2021, 16 pages.

(Continued)

*Primary Examiner* — Ryan S Cannon

(57) ABSTRACT

Intermediate temperature metallization pastes containing vanadium are disclosed. The metallization pastes can be used to fabricate electrodes interconnected to a transparent conductor.

24 Claims, 7 Drawing Sheets

| | Glass System | | | | | | | | Metalization Paste | | | |
|---|---|---|---|---|---|---|---|---|---|---|---|---|
| Type B | $V_2O_5$ (wt%) | PbO (wt%) | $TeO_2$ (wt%) | $Li_2O$ (wt%) | $V_2O_5/PbO/TeO_2$ (wt%) | Ratio $TeO_2/V_2O_5$ | Ratio $PbO/V_2O_5$ | Tg (°C) | Glass Content (wt%) | Resistivity (μΩ-cm) | Pull Strength (N) | Solderability |
| B1 | 25.1 | 57.8 | 16.5 | 0.52 | 99.5 | 0.66 | 2.3 | 233 | 0.7 | 2.92 | 1.30 | Very Good |
| | | | | | | | | | 1.4 | 2.92 | 2.42 | Very Good |
| B2 | 59.8 | 18.3 | 21.9 | 0 | 100 | 0.37 | 0.3 | 251 | 0.7 | 2.80 | 2.84 | Not Good |
| | | | | | | | | | 1.4 | 2.80 | 2.58 | Not Good |
| B3 | 38.8 | 35.7 | 25.5 | 0 | 100 | 0.66 | 0.9 | 260 | 0.7 | 2.92 | 2.78 | Acceptable |
| | | | | | | | | | 1.4 | 2.68 | 2.79 | Acceptable |
| B4 | 56.8 | 34.9 | 8.3 | 0 | 100 | 0.15 | 0.6 | 234 | 0.7 | 2.92 | 2.82 | Acceptable |
| | | | | | | | | | 1.4 | 2.92 | 2.92 | Acceptable |

(56) References Cited

U.S. PATENT DOCUMENTS

| | | |
|---|---|---|
| 2014/0352778 A1 | 12/2014 | Yang et al. |
| 2014/0360571 A1 | 12/2014 | Ji et al. |
| 2015/0027524 A1 | 1/2015 | Seyedmohammadi et al. |
| 2017/0141245 A1 | 5/2017 | Cheng et al. |
| 2017/0222085 A1 | 8/2017 | Cheong et al. |
| 2019/0131472 A1 | 5/2019 | Hsiao et al. |
| 2019/0221701 A1 | 7/2019 | Lin et al. |

OTHER PUBLICATIONS

International Preliminary Report on Patentability for Application No. PCT/US2021/036721, dated Dec. 29, 2022, 10 pages.
Abdulkadir et al., "Properties of indium tin oxide on black silicon after post-deposition annealing for heterojunction solar cells", Results in Physics, 2020, vol. 19, 103405, 7 pages.

| Type A | Glass System ||||||| | Metallization Paste ||||
|---|---|---|---|---|---|---|---|---|---|---|---|
| | $V_2O_5$ (wt%) | $Ag_2O$ (wt%) | $TeO_2$ (wt%) | $P_2O_5$ (wt%) | $Ag_2O+TeO_2$ (wt%) | Ratio $TeO_2/V_2O_5$ | Ratio $P_2O_5/V_2O_5$ | Tg (°C) | Glass Content (wt%) | Resistivity (μΩ-cm) | Pull Strength (N) | Solderability |
| A1 | 20 | 45 | 35 | 0 | 80 | 1.75 | 0.00 | 167 | 0.35 | 2.6 | 2.4 | Acceptable |
| A1 | 20 | 45 | 35 | 0 | 80 | 1.75 | 0.00 | 167 | 0.70 | 2.9 | 2.3 | Acceptable |
| A1 | 20 | 45 | 35 | 0 | 80 | 1.75 | 0.00 | 167 | 1.05 | 2.7 | 2.8 | Acceptable |
| A1 | 20 | 45 | 35 | 0 | 80 | 1.75 | 0.00 | 167 | 1.40 | 2.6 | 0.6 | Very Poor |
| A2 | 30 | 35 | 35 | 0 | 70 | 1.17 | 0.00 | 186 | 0.35 | 3.0 | 2.3 | Very Good |
| A2 | 30 | 35 | 35 | 0 | 70 | 1.17 | 0.00 | 186 | 0.70 | 2.9 | 2.6 | Not Good |
| A2 | 30 | 35 | 35 | 0 | 70 | 1.17 | 0.00 | 186 | 1.40 | 2.9 | 2.7 | Not Good |
| A3 | 20 | 35 | 45 | 0 | 80 | 2.25 | 0 | 195 | 0.35 | 3.1 | 2.3 | Very Good |
| A3 | 20 | 35 | 45 | 0 | 80 | 2.25 | 0 | 195 | 0.70 | 2.9 | 2.8 | Acceptable |
| A3 | 20 | 35 | 45 | 0 | 80 | 2.25 | 0 | 195 | 1.40 | 2.9 | 2.7 | Not Good |
| A4 | 15 | 46 | 36 | 3 | 82 | 2.33 | 0.21 | 228 | 1.05 | 3.3 | 1.7 | Very Poor |
| A5 | 10 | 47 | 36 | 6 | 83 | 3.50 | 0.62 | 197 | 1.05 | 3.0 | 2.3 | Acceptable |
| A6 | 0 | 49 | 38 | 13 | 87 | n/a | n/a | 175 | 1.05 | 4.7 | No Adhesion | |

FIG. 7

| Type B | Glass System |  |  |  |  |  |  | Metalization Paste |  |  |  |
|---|---|---|---|---|---|---|---|---|---|---|---|
|  | $V_2O_5$ (wt%) | PbO (wt%) | $TeO_2$ (wt%) | $Li_2O$ (wt%) | $V_2O_5/PbO/TeO_2$ (wt%) | Ratio $TeO_2/V_2O_5$ | Ratio $PbO/V_2O_5$ | Tg (°C) | Glass Content (wt%) | Resistivity (μΩ-cm) | Pull Strength (N) | Solderability |
| B1 | 25.1 | 57.8 | 16.5 | 0.52 | 99.5 | 0.66 | 2.3 | 233 | 0.7 | 2.92 | 1.30 | Very Good |
|  |  |  |  |  |  |  |  |  | 1.4 | 2.92 | 2.42 | Very Good |
| B2 | 59.8 | 18.3 | 21.9 | 0 | 100 | 0.37 | 0.3 | 251 | 0.7 | 2.80 | 2.84 | Not Good |
|  |  |  |  |  |  |  |  |  | 1.4 | 2.80 | 2.58 | Not Good |
| B3 | 38.8 | 35.7 | 25.5 | 0 | 100 | 0.66 | 0.9 | 260 | 0.7 | 2.92 | 2.78 | Acceptable |
|  |  |  |  |  |  |  |  |  | 1.4 | 2.68 | 2.79 | Acceptable |
| B4 | 56.8 | 34.9 | 8.3 | 0 | 100 | 0.15 | 0.6 | 234 | 0.7 | 2.92 | 2.82 | Acceptable |
|  |  |  |  |  |  |  |  |  | 1.4 | 2.92 | 2.92 | Acceptable |

FIG. 8

| Type C | Glass System | | | | | | Metallization Paste | | | |
|---|---|---|---|---|---|---|---|---|---|---|
| | PbO (wt%) | $V_2O_5$ (wt%) | $P_2O_5$ (wt%) | ZnO (wt%) | Ratio $P_2O_5$/PbO | Ratio ZnO/PbO | $T_g$ (°C) | Glass Content (wt%) | Resistivity ($\mu\Omega\cdot cm$) | Pull Strength (N) | Solderability |
| C1 | 43.90 | 43.90 | 2.31 | 4.26 | 0.053 | 0.097 | 263 | 1.0 | 4.9 | No Adhesion | |
| | | | | | | | | 2.0 | 2.8 | No Adhesion | |
| C2 | 43.44 | 44.44 | 2.34 | 3.08 | 0.053 | 0.069 | 261 | 1.0 | 2.9 | 1.5 | Very Good |
| | | | | | | | | 1.4 | 2.4 | 2.1 | Very Good |
| C3 | 44.90 | 44.90 | 2.37 | 2.07 | 0.053 | 0.046 | | | Glass not formed | | |
| C4 | 44.28 | 44.28 | 2.33 | 3.07 | 0.053 | 0.069 | 273 | 1.4 | 2.9 | 3.0 | Very Good |
| C5 | 44.15 | 44.15 | 2.33 | 3.06 | 0.053 | 0.069 | 275 | 1.4 | 3.0 | 2.8 | Very Good |
| C6 | 43.92 | 43.92 | 2.31 | 3.04 | 0.053 | 0.069 | 276 | 1.4 | 3.1 | 2.6 | Very Good |
| C7 | 43.77 | 43.77 | 2.31 | 3.03 | 0.053 | 0.069 | 278 | 1.4 | 3.1 | 2.7 | Very Good |
| C8 | 43.11 | 43.11 | 2.27 | 2.99 | 0.053 | 0.069 | 279 | 1.4 | 3.0 | 2.7 | Very Good |
| C9 | 42.35 | 42.35 | 2.23 | 2.93 | 0.053 | 0.069 | 281 | 1.4 | 3.1 | 2.4 | Very Good |
| C10 | 43.80 | 47.55 | 0 | 3.03 | 0 | 0.069 | 257 | 1.4 | 2.8 | 1.9 | Not Good |
| C11 | 45.21 | 40.72 | 5.15 | 3.13 | 0.114 | 0.069 | 283 | 1.4 | 2.8 | 1.4 | Not Good |
| C12 | 47.09 | 31.54 | 12.07 | 3.26 | 0.256 | 0.069 | 322 | 1.4 | 2.9 | 1.9 | Very Poor |
| C13 | 53.56 | 0 | 35.86 | 3.71 | 0.670 | 0.069 | 379 | 1.4 | 6.5 | No Adhesion | |

FIG. 9

VANADIUM-CONTAINING ELECTRODES AND INTERCONNECTS TO TRANSPARENT CONDUCTORS

This application is a continuation of U.S. application Ser. No. 17/323,672, filed on May 18, 2021, now allowed, which is a continuation-in-part of U.S. application Ser. No. 16/906,532, filed on Jun. 19, 2020, issued as U.S. Pat. No. 11,075,308, each of which is incorporated by reference in its entirety.

FIELD

Screen-printable thick-film metallization pastes for use in the fabrication of electrodes on a transparent conductor, and in particular for use in photovoltaic cells, are disclosed. The thick-film metallization pastes comprise a vanadium-based glass system that can be cured at temperatures from 350° C. to 500° C.

BACKGROUND

Tunnel oxide passivated contact (TopCon) photovoltaic cells with polysilicon-on-oxide (POLO) contacts have demonstrated efficiencies greater than 25%. Hydrogenated polycrystalline silicon (poly-Si) layers and transparent conductive oxide (TCO) layers are deposited over one or both surfaces of a textured, passivated, n-type silicon wafer forming passivated carrier-selective hetero-contacts. The tunnel oxide deposited directly on the wafer surfaces provides chemical passivation, yielding long minority carrier lifetimes. The doped poly-Si layers allow for selective carrier collection with the p-type doped layer acting as a hole-selective contact and the n-type doped layer serving as an electron-selective contact. The TCO layers enable an efficient contact to be made between the poly-Si doped layers and to overlying cell electrodes, provide lateral conduction, and function as an antireflection coating.

A performance limitation of TopCon/POLO technology is that the full-area hetero-contacts exhibit parasitic light absorption in the thin TCO film and in the poly-Si layers.

A process limitation of TopCon/POLO photovoltaic cells compared with diffused silicon technologies is that after the poly-Si layer is deposited, subsequent steps must be performed at low temperature to avoid degradation of the TCO properties. For example, metallization pastes having a low curing temperature must be used.

Low temperature metal/organic metallization pastes such as metallization pastes having a curing temperature of about 200° C. as are used, for example, in heterojunction with intrinsic thin layer (HIT) photovoltaic cells can have a line resistance that is two to three times higher than the line resistance of high temperature metallization pastes having a peak firing temperature, for example, of about 780° C.

The higher line resistance of electrodes formed using low-temperature metallization pastes imposes economical and performance limitations on electrode configurations.

Metallization pastes that cure at intermediate temperatures such as at about 400° C. used to form electrodes of TopCon/POLO photovoltaic cells can achieve low line resistivity that is similar to that of conventional high-temperature metallization pastes used for passivated emitter and rear contact (PERC) photovoltaic cells. At intermediate temperatures all the organic binder will have burnt out and longer curing periods such as several minutes, as opposed to under a minute in spike firing used for high-temperature metallization, yields high gridline conductivity.

To provide an economical process for manufacturing high efficiency TopCon/POLO photovoltaic cells, there is a need for an intermediate-temperature curing thick-film metallization paste that can be screen-printed to provide conductive grids with small feature dimensions and a high aspect ratio with printability resolution, and that exhibits low resistivity, high adhesion strength to a TCO film, and excellent solderability. The screen-printed metallization should also exhibit a low specific contact resistance, excellent junction ideality, and high fill factor (FF).

SUMMARY

According to the present invention, glass systems are prepared from a metal oxide composition comprising: from 5 wt % to 35 wt % vanadium pentoxide $V_2O_5$; from 30 wt % to 55 wt % silver oxide $Ag_2O$; and from 30 wt % to 50 wt % tellurium dioxide $TeO_2$; where wt % is based on the total weight of the metal oxide composition.

According to the present invention, glass systems are prepared from a metal oxide composition comprising: from 15 wt % to 65 wt % vanadium pentoxide $V_2O_5$; from 15 wt % to 65 wt % lead oxide PbO; and from 3 wt % to 31 wt % tellurium dioxide $TeO_2$; where wt % is based on the total weight of the metal oxide composition.

According to the present invention, glass systems are prepared from a metal oxide composition comprising: from 25 wt % to 50 wt % vanadium pentoxide $V_2O_5$; from 40 wt % to 55 wt % lead oxide PbO; from 0 wt % to 20 wt % phosphorous oxide $P_2O_5$; and from 2 wt % to 5 wt % zinc oxide ZnO; where wt % is based on the total weight of the metal oxide composition.

According to the present invention, metallization pastes comprise: a glass system according to the present invention; and electrically conductive metal particles.

According to the present invention, electrodes comprise a cured metallization paste according to the present invention.

According to the present invention, an electronic device comprises an electrode according to the present invention interconnected to a transparent conductor.

According to the present invention, methods of making a glass system comprise melting a metal oxide composition according to the present invention, at a temperature in the range of 800° C. to 1,300° C.

According to the present invention, method of forming an electrode, comprise: applying a metallization paste according to the present invention onto a transparent conductor; and curing the applied metallization paste to provide an electrode.

According to the present invention, electrodes are made by the method according to the present invention.

According to the present invention, a photovoltaic cell comprises an electrode according to the present invention interconnected to a transparent conductor.

BRIEF DESCRIPTION OF THE DRAWINGS

Those skilled in the art will understand that the drawings described herein are for illustration purposes only. The drawings are not intended to limit the scope of the present disclosure.

FIG. 7 is a table showing the composition of a Type A glass system provided by the present disclosure, properties of a Type A glass system, and properties of electrodes prepared using a Type A glass system.

FIG. 8 is a table showing the composition of a Type B glass system provided by the present disclosure, properties of a Type B glass system, and properties of electrodes prepared using a Type B glass system.

FIG. 9 is a table showing the composition of a Type C glass system provided by the present disclosure, properties of a Type C glass system, and properties of electrodes prepared using a Type C glass system.

DETAILED DESCRIPTION

Figure 1:
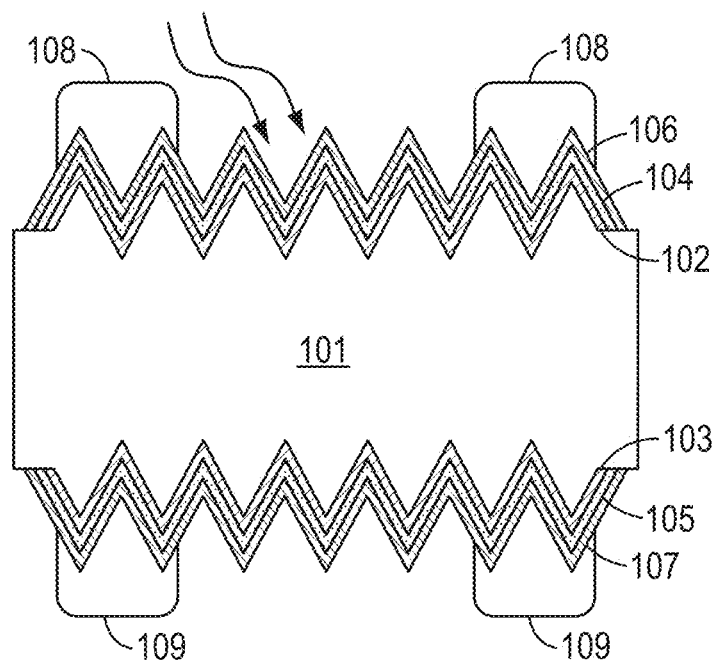
FIG. 1 shows an example of a TopCon/POLO photovoltaic cell with frontside and backside metallization grids provided by the present disclosure.

For purposes of the following detailed description, it is to be understood that embodiments provided by the present disclosure may assume various alternative variations and step sequences, except where expressly specified to the contrary. Moreover, other than in any operating examples, or where otherwise indicated, all numbers expressing, for example, quantities of ingredients used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

"Overlying" or "overlies" such as in the expression "layer A overlies layer B" refers to a layer that is on and contacts another layer, without any intervening layers, or a layer that is over another layer with one or more intervening layers between the two layers. For example, the expression "layer A overlies layer B" means that layer A is on and contacts layer B or that there are one or more layers between layer A and layer B. As a specific example, a structure in which an electrode provided by the present disclosure overlies a transparent conductor can mean that the electrode is on top of and contacts the transparent conductor without any intervening layers between the electrode and the transparent conductor. A structure in which an electrode provided by the present disclosure overlies a transparent conductor can also mean that there are one or more material layers between the electrode and the transparent conductor.

Reference is now made to certain glass systems, metallization pastes, electrodes, electronic devices, and methods encompassed by the present invention. The disclosed glass systems, metallization pastes, electrodes, electronic devices, and methods are not intended to be limiting of the claims. To the contrary, the claims are intended to cover all alternatives, modifications, and equivalents.

Glass systems provided by the present disclosure contain vanadium. The vanadium-containing glass systems can be incorporated into a metallization paste used to fabricate electrodes. The metallization pastes provided by the present disclosure can be cured at temperatures from 350° C. to 500° C. to form electrodes. When applied to transparent conductors that can be damaged during exposure to temperatures above about 500° C., the metallization pastes containing the vanadium-containing glass systems can be cured to form electrodes interconnected to the transparent conductors without damaging the transparent conductors.

By way of example, photovoltaic devices comprising a transparent conductor such as transparent conductive oxide are disclosed. However, the glass systems, metallization pastes, and electrodes can be used with any suitable electronic device comprising a transparent conductor. Examples of suitable electronic devices include photovoltaic devices, touch panels, liquid crystal displays, light emitting diodes including organic light-emitting devices, photodetectors, optoelectronic devices, plasmonic devices, thin film transistors, organic electronic devices, electromagnetic radiation sensors, chemical sensors, tactile sensors, and flexible electronic devices.

Furthermore, although transparent conductive oxide films are referred to throughout, the metallization pastes provided by the present disclosure can be used to form electrodes to any suitable transparent conductor. The materials and methods are particularly useful in forming interconnects to transparent conductors that would otherwise degrade during exposure to temperatures greater than about 500° C. Examples of suitable transparent conductors include transparent conductive oxides, metallic nanostructures such as metal films, correlated-metal films, conductive grids, metallic nanowires, metallic meshes, carbon nanotube films, conductive polymer films, polymer dielectric films, organic conductors, graphene films, and combinations of any of the foregoing.

A transparent conductor can transmit, for example, greater than 60% of the incident electromagnetic radiation over a desired wavelength range, over 70%, over 80%, over 90%, or over 95% of the incident electromagnetic radiation over a desired wavelength range. Transparent conductors can have a thickness, for example, from 1 nm to 250 nm, from 1 nm to 200 nm, from 5 nm to 100 nm, or from 10 nm to 50 nm. A transparent conductor can have a thickness, for example, less than 250 nm, less than 200 nm, less than 150 nm, less than 100 nm, less than 50 nm, or less than 20 nm. A transparent conductor can have a thickness, for example, greater than 1 nm, greater than 10 nm, greater than 20 nm, greater than 50 nm, greater than 100 nm, greater than 150 nm, or greater than 200 nm.

A transparent conductor can be a composite conductor where the transparent conductor comprises more than one layer of transparent and/or conductive material.

A transparent conductor can transmit electromagnetic radiation over a narrow or broad wavelength range as appropriate for a particular application. A transparent conductor can be transmissive, for example, in at least a portion of the infrared spectrum within a wavelength range from 700 nm to 1 mm, at least a portion of the visible spectrum within a wavelength range from 400 nm to 700 nm, or at least a portion of the ultraviolet spectrum within a wavelength range from 10 nm to 400 nm.

A metallization paste provided by the present disclosure can have a curing temperature, for example, from 350° C. to 500° C., such as from 375° C. to 475° C., or from 350° C. to 450° C. A metallization paste provided by the present disclosure can have a curing temperature, for example, less than 500° C., less than 475° C., less than 450° C., less than 425° C., less than 400° C., or less than 375° C. A metallization paste provided by the present disclosure can have a curing temperature, for example, greater than 350° C., greater than 375° C., greater than 400° C., greater than 425° C., greater than 450° C., or greater than 475° C.

The organic constituents of a metallization paste provided by the present disclosure are selected such that the organic constituents burn-off when exposed to temperature less than or equal to 350° C. for a duration, for example, from 5 minutes to 90 minutes. The organic constituents can be selected such that the organic constituents burn-off when exposed to a temperature, for example, of less than or equal to 350° C., less than 300° C., less than 275° C., less than 250° C., less than 225° C., or less than 200° C., for a duration, for example, of from 1 minute to 90 minutes such as from 5 minutes to 90 minutes, or from 10 minutes to 60 minutes.

The inorganic constituents of a metallization paste provided by the present disclosure such as a metal powder and a vanadium-containing glass system can be selected such the inorganic constituents fuse or cure to form a robust interconnect at temperatures less than 500° C. to avoid degrading the properties such as the sheet resistance of the underlying transparent conductor.

Intermediate temperature metallization pastes provided by the present disclosure can be used to form the electrodes to TopCon/POLO and IBC photovoltaic cells.

In general, for photovoltaic cell electrode applications, thick-film metallization pastes are used to form the conductive grids or metal contacts. Thick-film metallization pastes can include a suspension of conductive metal, a glass system, and an organic vehicle. Silver is the most common conductive filler used for metallization paste. A glass system is used to bind the functional/conductive phase to a silicon wafer after thermal treatment. For conventional silicon photovoltaic cells with silicon nitride antireflection coating, the glass system can also be used to etch through the anti-reflective and passivation layers to provide ohmic contact between the electrodes and the silicon surface of the photovoltaic cell.

For TopCon/POLO photovoltaic cells an electrode contact can be made directly to the transparent conductor such as a TCO film; and therefore, the glass system does not serve as an etchant. The vehicle is an organic system that acts as a rheological carrier to control flow and printability of the paste. The organic vehicle is composed of resins, solvents, and additives. The attributes of the metallization paste, in particular the front-side silver-containing metallization paste, is important for achieving high efficiency photovoltaic cells. Therefore, the quality and performance of the metallization paste affects the economics of photovoltaic systems. The screen-printing technology that is currently used for the majority of photovoltaic cells is being further developed for printing fine-line conductive grids to reduce silver consumption and thereby reduce cost, to reduce shading and thereby increase the current density, and to improve photovoltaic module performance.

To maintain high efficiencies over time it is important that the pull strength and the adhesion of the photovoltaic cell metallization to the underlying surface such as a transparent conductor be robust. To also achieve high pull strength is challenging because as the content of the glass system in the metallization paste, which acts as the binder, is increased to improve the adhesion strength, the contact resistance of the electrode also increases resulting in the concomitant decrease in the fill factor (FF) and the overall conversion efficiency for the photovoltaic cell. Increasing the amount of glass in the metallization paste can decrease the solderability and, in the case of non-conductive glass systems, can increase the contact resistivity and decrease the fill factor (FF).

Figure 2:
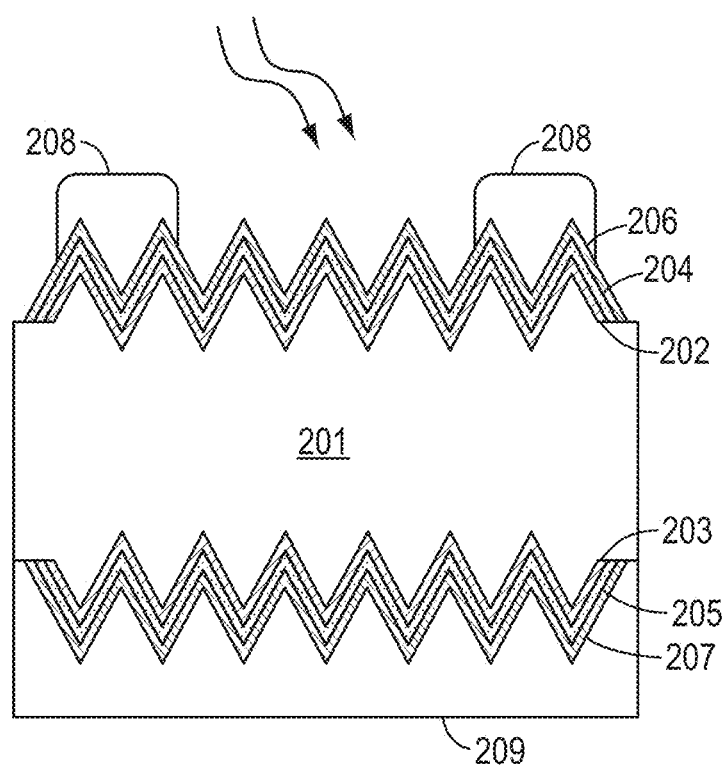
FIG. 2 shows an example of a TopCon/POLO photovoltaic cell with frontside and backside metallization grids provided by the present disclosure.
Figure 3:
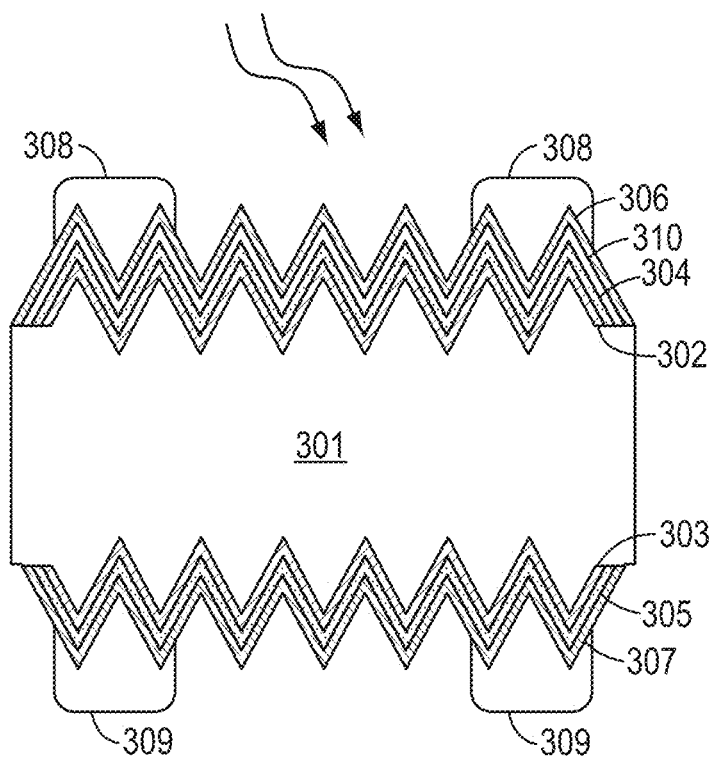
FIG. 3 shows an example of a TopCon/POLO photovoltaic cell with frontside and backside metallization grids provided by the present disclosure.
Figure 4:
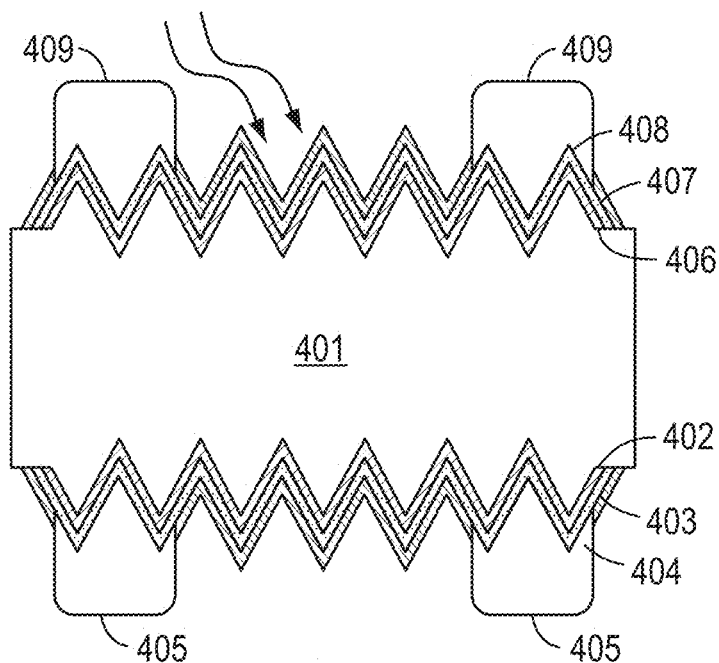
FIG. 4 shows an example of a photovoltaic cell with frontside diffused contact metallization grid and a backside tunnel oxide passivated contact metallization grid provided by the present disclosure.

Examples of TopCon/POLO photovoltaic cells are shown in FIGS. 1-3. Bifacial (FIGS. 1 and 3) and monofacial (FIG. 2) photovoltaic cells include an n-type c-Si water with opposing n-doped polysilicon and p-doped polysilicon layers with overlying transparent conductors such as TCO films. For monofacial TopCon/POLO photovoltaic cells the entire backside surface can be metallized, and the frontside surface has an electrode grid. For a bifacial TopCon/POLO photovoltaic cell both the frontside and backside surfaces have an electrode grid contacting the transparent conductor such as a TCO film. An IBC photovoltaic cell is shown in FIG. 4 and includes interdigitated electrode grids on the backside of the photovoltaic cell.

The electrodes can be formed using a metallization paste that can be cured at an intermediate temperature such as at temperatures from 350° C. to 500° C.

Intermediate-temperature metallization pastes provided by the present disclosure can comprise a vanadium-containing glass system.

Vanadium-containing glass systems provided by the present disclosure comprise vanadium as a significant component by wt % based on the total weight of the glass system. Three types of glass systems are disclosed. Type A glass systems contain vanadium and tellurium and do not contain lead. Type B glass systems contain vanadium, lead, and tellurium. Type C glass systems contain vanadium and lead, and do not contain tellurium. Type A glass systems are electrically conductive. Type B and C glass systems are not electrically conductive.

A glass system can be prepared by combining metal oxides and heating the mixture of metal oxides to a temperature, for example, from 800° C. to 1,300° C. for a duration, for example, from 30 minutes to 100 minutes sufficient to melt the oxides to form a homogeneous glass composition. The glass system is then quenched and subsequently milled to provide glass particles having a desired diameter and particle size distribution for incorporating into a metallization paste.

A glass system provided by the present disclosure can be used in an intermediate-temperature metallization paste for making electrical contacts to transparent conductors such as TCO films. Examples of suitable materials for TCO films include $In_2O_3$:H (IO:H), InSnO (ITO), InZnO (a-IZO), $In_2O_3$:Zr (ZrIO); ZnO:Al (AZO), ZnSnO (a-ZTO), ZnO:B (BZO), ZnO:B (BZO), ZnO:Ga (GZO), $SnO_2$, ZnO, CdSnO$_2$, and CdO:In. For example, a TCO film can be an indium tin oxide (ITO) film. A TCO film such as an ITO film can have a thickness, for example, from 1 nm to 250 nm, from 10 nm to 250 nm, from 20 nm to 200 nm, or from 20 nm to 80 nm, and a refractive index of about 2.0.

A glass system provided by the present disclosure can have a glass transition temperature T$_g$, for example, less than 400° C., less than 350° C., less than 300° C., less than 250° C., or less than 200° C. A glass system provided by the present disclosure can have a glass transition temperature T$_g$, for example, from 150° C. to 400° C., from 150° C. to 300° C., from 150° C. to 200° C., from 200° C. to 400° C., from 200° C. to 300° C., from 250° C. to 400° C., or from 250° C. to 300° C.

A glass system provided by the present disclosure can have a glass transition temperature T$_g$, for example, from 200° C. to 300° C., such as from 225° C. to 290° C.

A glass system provided by the present disclosure can have a softening point, for example, less than 400° C., less than 350° C., less than 300° C., or less than 250° C. A glass system provided by the present disclosure can have a softening point, for example, from 200° C. to 400° C., from 300° C. to 400° C., from 250° C. to 400° C., from 250° C. to 375° C., from 275° C. to 400° C., or from 275° C. to 375° C.

A glass system provided by the present disclosure can have a softening point, for example, less than 380° C., such as from 250° C. to 380° C.

A glass system provided by the present disclosure can be prepared from a metal oxide composition comprising, for example, from 5 wt % to 60 wt % vanadium (V) oxide V$_2$O$_5$, from 5 wt % to 50 wt %, from 5 wt % to 40 wt %, from 5 wt % to 30 wt %, from 10 wt % to 50 wt %, from 10 wt % to 40 wt %, from 20 wt % to 50 wt %, or from 30 wt % to 50 wt % vanadium (V) oxide V$_2$O$_5$, where wt % is based on the total weight of the metal oxide composition.

Glass systems provided by the present disclosure are vitrifying, non-crystallizing glasses.

A Type A glass system contains vanadium, silver, and tellurium.

A Type A glass system can be prepared from a metal oxide composition comprising, for example, from 15 wt % to 35 wt % vanadium pentoxide V$_2$O$_5$; from 30 wt % to 55 wt % silver oxide Ag$_2$O; and from 30 wt % to 50 wt % tellurium dioxide TeO$_2$; where wt % is based on the total weight of the metal oxide composition.

A Type A glass system can be prepared from a metal oxide composition comprising, for example, from 5 wt % to 35 wt % vanadium pentoxide V$_2$O$_5$, from 10 wt % to 32.5 wt %, from 15 wt % to 30 wt %, or from 20 wt % to 25 wt % vanadium pentoxide V$_2$O$_5$, where wt % is based on the total weight of the metal oxide composition.

A Type A glass system can be prepared from a metal oxide composition comprising, for example, from 30 wt % to 50 wt % silver oxide Ag$_2$O, from 32.5 wt % to 47.5 wt %, from 35 wt % to 45 wt %, or from 37.5 wt % to 42.5 wt % silver oxide Ag$_2$O, where wt % is based on the total weight of the metal oxide composition.

A Type A glass system can be prepared from a metal oxide composition comprising, for example, from 30 wt % to 50 wt % tellurium dioxide TeO$_2$, from 32.5 wt % to 47.5 wt %, from 35 wt % to 45 wt %, or from 37.5 wt % to 42.5 wt % tellurium dioxide TeO$_2$, where wt % is based on the total weight of the metal oxide composition.

A Type A glass system can be prepared from a metal oxide composition comprising, for example, from 17.5 wt % to 32.5 wt % vanadium pentoxide V$_2$O$_5$; from 32.5 wt % to 47.5 wt % silver oxide Ag$_2$O; and from 32.5 wt % to 47.5 wt % tellurium dioxide TeO$_2$, where wt % is based on the total weight of the metal oxide composition.

A Type A glass system can be prepared from a metal oxide composition comprising, for example, from 20 wt % to 30 wt % vanadium pentoxide V$_2$O$_5$; from 35 wt % to 45 wt % silver oxide Ag$_2$O; and from 35 wt % to 45 wt % tellurium dioxide TeO$_2$, where wt % is based on the total weight of the metal oxide composition.

A Type A glass system can be prepared from a metal oxide composition comprising, for example, from 20 wt % to 30 wt % vanadium pentoxide V$_2$O$_5$; from 30 wt % to 45 wt % silver oxide Ag$_2$O; and from 35 wt % to 45 wt % tellurium dioxide TeO$_2$, where wt % is based on the total weight of the metal oxide composition.

A Type A glass system can be prepared from a metal oxide composition comprising, for example, from 5 wt % to 25 wt % vanadium pentoxide V$_2$O$_5$; from 40 wt % to 55 wt % silver oxide Ag$_2$O; and from 30 wt % to 40 wt % tellurium dioxide TeO$_2$, where wt % is based on the total weight of the metal oxide composition.

A metal oxide composition for forming a Type A glass system can comprise, for example, from 60 wt % to 85 wt % of a combination of silver oxide Ag$_2$O and tellurium dioxide TeO$_2$, from 67.5 wt % to 82.5 wt %, or from 70 wt % to 80 wt % of a combination of silver oxide Ag$_2$O and tellurium dioxide TeO$_2$; where wt % is based on the total weight of the metal oxide composition.

A metal oxide composition for forming a Type A glass system can have, for example, a wt % ratio of tellurium dioxide TeO$_2$ to vanadium pentoxide V$_2$O$_5$ from 0.8 to 10, such as from 1 to 5, or from 1.2 to 2.5; where wt % is based on the total weight of the metal oxide composition.

A metal oxide composition for forming a Type A glass system can further comprise, for example, less than 1 wt % tungsten oxide WO$_3$, less than 1 wt % ferrous oxide FeO, or a combination thereof, wherein wt % is based on the total weight of the metal oxide composition. Tungsten oxide WO$_3$ and ferrous oxide FeO can improve the mechanical strength of a cured metallization paste containing Type A glass system.

A Type A glass system can be prepared from a metal oxide composition by melting the metal oxide composition to a temperature, for example, from 800° C. to 1100° C. for a duration, for example, from 30 minutes to 100 minutes after which the glass system can be quenched and milled to provide a desired average particle size (D50).

A Type A glass system can be characterized by an average particle diameter D50, for example, from 0.1 μm to 20 μm, such as from 0.5 μm to 18 μm, from 1 μm to 16 μm, or from 1 μm to 10 μm, where the average particle size diameter is determined by Malvern Mastersizer 3000 particle size laser diffraction particle size analyzer.

Type A glass system can have a glass transition temperature T$_g$, for example, from 150° C. to 200° C. such as from 160° C. to 190° C., where the glass transition temperature is determined using a Mettler-Toledo TGA/DSC Thermal Analyzer.

A Type A glass system can have a softening point, for example, from 200° C. to 350° C., such as from 205° C. to 335° C., where the softening point is determined by dilatometry and is considered to be the temperature at which the glass system begins to flow under its own weight.

A Type A glass system can comprise, for example, from 2.5 wt % to 20 wt % vanadium V; from 27 wt % to 52 wt % silver Ag; and from 23 wt % to 40 wt % tellurium Te; wherein wt % is based on the total weight of the glass system.

A Type A glass system can comprise, for example, from 8 wt % to 17 wt % vanadium V; from 30 wt % to 45 wt % silver Ag; and from 26 wt % to 38 wt % tellurium Te; wherein wt % is based on the total weight of the glass system.

A Type A glass system can comprise, for example, from 10 wt % to 16 wt % vanadium V; from 32 wt % to 42 wt % silver Ag; and from 28 wt % to 36 wt % tellurium Te; wherein wt % is based on the total weight of the glass system.

A Type A glass system can further independently comprise less than 1 wt % tungsten oxide $WO_3$ and/or ferrous oxide FeO, where wt % is based on the total weight of the glass system.

A Type A glass system can independently comprise, for example, from 0.05 wt % to 1 wt % tungsten oxide $WO_3$ and/or ferrous oxide FeO, from 0.1 wt % to 0.8 wt %, or from 0.2 wt % to 0.6 wt % tungsten oxide $WO_3$ and/or ferrous oxide FeO, where wt % is based on the total weight of the glass system.

A Type B glass system can comprise vanadium, lead, and tellurium.

A Type B glass system can be prepared from a metal oxide composition comprising, for example, from 15 wt % to 65 wt % vanadium pentoxide $V_2O_5$; from 15 wt % to 65 wt % lead oxide PbO; and from 3 wt % to 31 wt % tellurium dioxide $TeO_2$, where wt % is based on the total weight of the metal oxide composition.

A Type B glass system can be prepared from a metal oxide composition comprising, for example, from 15 wt % to 65 wt % vanadium pentoxide $V_2O_5$, from 25 wt % to 55 wt %, from 30 wt % to 50 wt %, or from 35 wt % to 45 wt % vanadium pentoxide $V_2O_5$, where wt % is based on the total weight of the metal oxide composition.

A Type B glass system can be prepared from a metal oxide composition comprising, for example, from 15 wt % to 65 wt % lead oxide PbO, from 25 wt % to 60 wt %, from 30 wt % to 50 wt %, or from 32.5 wt % to 37.5 wt % lead oxide PbO, where wt % is based on the total weight of the metal oxide composition.

A Type B glass system can be prepared from a metal oxide composition comprising, for example, from 3 wt % to 31 wt % tellurium dioxide $TeO_2$, from 8 wt % to 22.5 wt %, or from 12.5 wt % to 20 wt % tellurium dioxide $TeO_2$, where wt % is based on the total weight of the metal oxide composition.

A Type B glass system can be prepared from a metal oxide composition comprising, for example, from 20 wt % to 50 wt % vanadium pentoxide $V_2O_5$; from 35 wt % to 60 wt % lead oxide PbO; and from 10 wt % to 22.5 wt % tellurium dioxide $TeO_2$, where wt % is based on the total weight of the metal oxide composition.

A Type B glass system can be prepared from a metal oxide composition comprising, for example, from 30 wt % to 50 wt % vanadium pentoxide $V_2O_5$; from 45 wt % to 60 wt % lead oxide PbO; and from 12.5 wt % to 20 wt % tellurium dioxide $TeO_2$, where wt % is based on the total weight of the metal oxide composition.

A Type B glass system can be prepared from a metal oxide composition comprising, for example, from 20 wt % to 60 wt % vanadium pentoxide $V_2O_5$; from 30 wt % to 60 wt % lead oxide PbO; and from 5 wt % to 30 wt % tellurium dioxide $TeO_2$, where wt % is based on the total weight of the metal oxide composition.

A Type B glass system can be prepared from a metal oxide composition comprising, for example, from 20 wt % to 30 wt % vanadium pentoxide $V_2O_5$; from 50 wt % to 65 wt % lead oxide PbO; and from 10 wt % to 25 wt % tellurium dioxide $TeO_2$, where wt % is based on the total weight of the metal oxide composition.

A metal oxide composition for forming a Type B glass system can comprise, for example, greater than 98 wt % of a combination of $V_2O_5$, PbO, and $TeO_2$, greater than 98.5 wt %, or greater than 99 wt % of a combination of $V_2O_5$, PbO, and $TeO_2$, where wt % is based on the total weight of the metal oxide composition.

A metal oxide composition for forming a Type B glass system can comprise, for example, a wt % ratio of $TeO_2$ to $V_2O_5$ from 0.05 to 2, from 0.1 to 1, or from 0.3 to 0.7, where wt % is based on the total weight of the metal oxide composition.

A metal oxide composition for forming a Type B glass system can comprise, for example, a wt % ratio of PbO to $V_2O_5$ from 0.2 to 4.5, from 0.4 to 2.5, from 0.6 to 2.3, from 0.7 to 2.5, or from 1 to 2, where wt % is based on the total weight of the metal oxide composition.

A metal oxide composition for forming a Type B glass system can further comprise, for example, from 0 wt % to 1.5 wt % lithium oxide $Li_2O$, such as from 0.1 wt % to 1.3 wt %, from 0.2 wt % to 1.1 wt % or from 0.3 wt % to 1.0 wt % lithium oxide $Li_2O$, where wt % is based on the total weight of the metal oxide composition. Lithium oxide can improve the solderability of an electrode made from a metallization paste comprising a Type B glass system.

A metal oxide composition for forming a Type B glass system can further comprise, for example, less than 1 wt % tungsten oxide $WO_3$, less than 1 wt % ferrous oxide FeO, or a combination thereof, where wt % is based on the total weight of the metal oxide composition. Tungsten oxide $WO_3$ and ferrous oxide FeO can improve the mechanical strength of a cured metallization paste containing a Type B glass system.

A Type B glass system can be prepared from a metal oxide composition by melting the metal oxide composition at a temperature, for example, from 800° C. to 1,200° C. for a duration, for example, from 30 minutes to 100 minutes, and milling the quenched glass to provide glass particles having a desired average particle size diameter.

A Type B glass system can be characterized by an average particle size diameter D50, for example, from 0.1 µm to 20 µm, such as from 0.5 µm to 18 µm, from 1 µm to 15 µm, or from 1 µm to 10 µm, where the average particle size diameter is determined using a Malvern Mastersizer 3000 laser diffraction particle size analyzer.

A Type B glass system can have a glass transition temperature $T_g$, for example, from 230° C. to 260° C., such as from 235° C. to 255° C., where the glass transition temperature is determined using a Mettler-Toledo TGA/DSC Thermal Analyzer.

A Type B glass system can have a softening point, for example, from 250° C. to 400° C., such as from 275° C. to 375° C., where the softening point is determined by dilatometry and is considered to be the temperature at which the glass system begins to flow.

A Type B glass system can comprise, for example, from 8 wt % to 40 wt % vanadium V; from 12 wt % to 61 wt % lead Pb; and from 2 wt % to 25 wt % tellurium Te, where wt % is based on the total weight of the glass system.

A Type B glass system can comprise, for example, from 11 wt % to 37.5 wt % vanadium V; from 20 wt % to 57.5 wt % lead Pb; and from 7.5 wt % to 15.5 wt % tellurium Te, where wt % is based on the total weight of the glass system.

A Type B glass system can comprise, for example, from 13.5 wt % to 30 wt % vanadium V; from 23 wt % to 55 wt % lead Pb; and from 7.5 wt % to 12.5 wt % tellurium Te, where wt % is based on the total weight of the glass system.

A Type B glass system can further comprise less than 1.5 wt % lithium, such as less than 1.25 wt %, less than 1.0 wt %, or less than 0.75 wt % lithium, where wt % is based on the total weight of the glass system.

A Type B glass system can further independently comprise less than 1 wt % tungsten oxide $WO_3$ and/or ferrous oxide FeO, where wt % is based on the total weight of the glass system.

A Type B glass system can independently comprise, for example, from 0.05 wt % to 1 wt % tungsten oxide $WO_3$ and/or ferrous oxide FeO, from 0.1 wt % to 0.8 wt %, or from 0.2 wt % to 0.6 wt % tungsten oxide $WO_3$ and/or ferrous oxide FeO, where wt % is based on the total weight of the glass system.

A Type C glass system can comprise vanadium, lead, phosphorous, and zinc.

A Type C glass system can be prepared from a metal oxide composition comprising, for example, from 25 wt % to 50 wt % vanadium pentoxide $V_2O_5$; from 40 wt % to 55 wt % lead oxide PbO; from 0 wt % to 20 wt % phosphorous oxide $P_2O_5$; and from 2 wt % to 5 wt % zinc oxide ZnO; where wt % is based on the total weight of the metal oxide composition.

A Type C glass system can be prepared from a metal oxide composition comprising, for example, from 25 wt % to 50 wt % vanadium pentoxide $V_2O_5$, or from 40 wt % to 45 wt % vanadium pentoxide $V_2O_5$, where wt % is based on the total weight of the metal oxide composition.

A Type C glass system can be prepared from a metal oxide composition comprising, for example, from 40 wt % to 55 wt % lead oxide PbO, such as from 40 wt % to 45 wt % lead oxide PbO, where wt % is based on the total weight of the metal oxide composition.

A Type C glass system can be prepared from a metal oxide composition comprising, for example, from 0.01 wt % to 20 wt % phosphorous oxide $P_2O_5$, such as from 2 wt % to 5.5 wt % phosphorous oxide $P_2O_5$, where wt % is based on the total weight of the metal oxide composition.

A Type C glass system can be prepared from a metal oxide composition comprising, for example, from 2 wt % to 5 wt % zinc oxide ZnO such as from 2.5 wt % to 3 wt % zinc oxide ZnO, where wt % is based on the total weight of the metal oxide composition.

A Type C glass system can be prepared from a metal oxide composition comprising, for example, from 40 wt % to 45 wt % vanadium pentoxide $V_2O_5$; from 40 wt % to 45 wt % lead oxide PbO; from 2 wt % to 5.5 wt % phosphorous oxide $P_2O_5$; and from 2.5 wt % to 3.3 wt % zinc oxide ZnO; where wt % is based on the total weight of the metal oxide composition.

A Type C glass system can be prepared from a metal oxide composition comprising, for example, from 40 wt % to 45 wt % vanadium pentoxide $V_2O_5$; from 40 wt % to 45 wt % lead oxide PbO; from 2 wt % to 2.5 wt % phosphorous oxide $P_2O_5$; and from 2.5 wt % to 3.3 wt % zinc oxide ZnO; where wt % is based on the total weight of the metal oxide composition.

A metal oxide composition for forming a Type C glass system can further comprise, for example, less than 1 wt % bismuth oxide $Bi_2O_3$ such as less than 0.7 wt % bismuth oxide $Bi_2O_3$, wherein wt % is based on the total weight of the metal oxide composition.

A metal oxide composition for forming a Type C glass system can further comprise, for example, less than 1 wt % cuprous oxide $Cu_2O$ such as less than 0.7 wt % cuprous oxide $Cu_2O$, wherein wt % is based on the total weight of the metal oxide composition.

A metallization paste for forming a Type C glass system comprise, for example, a wt % ratio of $P_2O_5$ to PbO from 0 to 0.5, such as from 0.05 to 0.25, or from 0.05 to 0.1, where wt % is based on the total weight of the metal oxide composition.

A metallization paste for forming a Type C glass system can comprise, for example, a wt % ratio of ZnO to lead oxide PbO from 0.035 to 0.125, such as from 0.045 to 0.070, where wt % is based on the total weight of the metal oxide composition.

A metal oxide composition for forming a Type C glass system can further comprise, for example, less than 1 wt % tungsten oxide $WO_3$, less than 1 wt % ferrous oxide FeO, or a combination thereof, wherein wt % is based on the total weight of the metal oxide composition. Tungsten oxide $WO_3$ and ferrous oxide FeO can improve the mechanical strength of a cured metallization paste containing a Type C glass system.

A Type C glass system can be prepared from a metal oxide composition by melting the metal oxide composition at a temperature, for example, from 800° C. to 1,300° C. for a duration, for example, from 30 minutes to 100 minutes, and milling the quenched glass to provide glass particles having a desired average particle size diameter for incorporation into a metallization paste.

A Type C glass system can be characterized by an average particle diameter D50, for example, from 0.1 μm to 20 μm, such as from 0.5 μm to 18 μm, from 1 μm to 15 μm, or from 1 μm to 10 μm, where the average particle size diameter is determined using a Malvern Mastersizer 3000 laser diffraction particle size analyzer.

A Type C glass system can have a glass transition temperature $T_g$, for example, from 260° C. to 285° C. such as from 265° C. to 280° C., where the glass transition temperature is determined using a Mettler-Toledo TGA/DSC Thermal Analyzer.

A Type C glass system can have a softening point, for example, from 280° C. to 400° C., such as from 300° C. to 375° C., where the softening point is determined by dilatometry and is considered to be the temperature at which the glass system begins to flow.

A Type C glass system can comprise, for example, from 13 wt % to 30 wt % vanadium V; from 37 wt % to 52 wt % lead Pb; from 0 wt % to 9 wt % phosphorous P; and from 1.6 wt % to 4.1 wt % zinc Zn; where wt % is based on the total weight of the glass system.

A Type C glass system can comprise, for example, from 22 wt % to 26 wt % vanadium V; from 37 wt % to 51 wt % lead Pb; from 0.5 wt % to 2.2 wt % phosphorous P; and from 2.3 wt % to 3 wt % zinc Zn; where wt % is based on the total weight of the glass system.

A Type C glass system can further independently comprise less than 1 wt % $Bi_2O_3$ and/or less than 1 wt % CuO, such as less than 0.7 wt % $Bi_2O_3$ and/or less than 0.7 wt % CuO where wt % is based on the total weight of the glass system.

A Type C glass system can further independently comprise less than 1 wt % tungsten oxide $WO_3$ and/or ferrous oxide FeO, where wt % is based on the total weight of the glass system.

A glass system can be characterized, for example, by an average particle diameter D50 within a range from 0.1 μm to 20 μm, such as from 0.1 μm to 15 μm, from 0.1 μm to 10 μm, or from 1 μm to 10 μm, and may be present in the metallization paste in an amount of about 0.1 wt % to about 10 wt %, where wt % is based on the total weight of the metallization paste. The average particle diameter can be determined using a particle size analyzer. A glass system can have a substantially spherical or an irregular shape.

Glass systems provided by the present disclosure can be conductive, such as ionically conductive. For example, a glass system provided by the present disclosure, such as a Type A glass system, can have a conductivity greater than $1 \times 10^{-11}$ S/cm, greater than $1 \times 10^{-10}$ S/cm, greater than $1 \times 10^{-9}$ S/cm, greater than $1 \times 10^{-8}$ S/cm, or greater than $1 \times 10^{-7}$ S/cm, at 20° C. A glass system, such a Type A glass system, can have a conductivity, for example, from $1 \times 10^{-11}$ S/cm to $1 \times 10^{-7}$ S/cm, from $1 \times 10^{-10}$ S/cm to $1 \times 10^{-8}$ S/cm, or from $1 \times 10^{-10}$ S/cm to $1 \times 10^{-9}$ S/cm, at 20° C.

Glass systems provided by the present disclosure, such as a Type A glass system, can have a resistivity, for example, less than $1 \times 10^{11}$ Ω-cm, less than $1 \times 10^{10}$ Ω-cm, less than $1 \times 10^{9}$ Ω-cm, less than $1 \times 10^{8}$ Ω-cm, or less than $1 \times 10^{7}$ Ω-cm, at 20° C. A glass system, such as a Type A glass system, can have a resistivity, for example, from $1 \times 10^{11}$ Ω-cm to $1 \times 10^{7}$ Ω-cm, from $1 \times 10^{11}$ Ω-cm to $1 \times 10^{8}$ Ω-cm, or from $1 \times 10^{11}$ Ω-cm to $1 \times 10^{9}$ Ω-cm, at 20° C.

A metallization paste provided by the present disclosure can be used to make electrical interconnection to a transparent conductor. For example, a transparent conductor can be a transparent conductive oxide film such as a TCO film used in TopCon/POLO photovoltaic cells.

A metallization paste provided by the present disclosure can have a low content of a vanadium-containing glass system provided by the present disclosure. For example, a metallization paste can have less than 1.9 wt % of a glass system provided by the present disclosure, less than 1.7 wt %, less than 1.6 wt %, less than 1.5 wt %, or less than 1.4 wt % of a glass system, where wt % is based on the total weight of the metallization paste. A metallization paste can have, for example, from 0.1 wt % to 1.9 wt % of a glass system provided by the present disclosure, from 0.2 wt % to 1.7 wt %, from 0.5 wt % to 1.5 wt %, from 0.7 wt % to 1.3 wt %, or from 0.8 wt % to 1.2 wt % of a glass system, where wt % is based on the total weight of the metallization paste.

A metallization paste provided by the present disclosure can comprise, for example, less than 1.4 wt % of a Type A glass system, less than 1.2 wt %, less than 1.0 wt %, less than 0.8 wt %, or less than 0.5 wt % of a Type A glass system, where wt % is based on the total weight of the metallization paste. A metallization paste provided by the present disclosure can comprise, for example, from 0.1 wt % to 1.3 wt % of a Type A glass system, from 0.2 wt % to 1.2 wt %, from 0.3 wt % to 1.1 wt %, or from 0.4 wt % to 1.0 wt %, where wt % is based on the total weight of the metallization paste.

A metallization paste provided by the present disclosure can comprise, for example, less than 1.4 wt % of a Type B glass system, less than 1.2 wt %, less than 1.0 wt %, less than 0.8 wt %, or less than 0.5 wt % of a Type A glass system, where wt % is based on the total weight of the metallization paste. A metallization paste provided by the present disclosure can comprise, for example, from 0.1 wt % to 1.3 wt % of a Type B glass system, from 0.2 wt % to 1.2 wt %, from 0.3 wt % to 1.1 wt %, or from 0.4 wt % to 1.0 wt %, of a Type B glass system, where wt % is based on the total weight of the metallization paste.

A metallization paste provided by the present disclosure can comprise, for example, less than 2 wt % of a Type C glass system, less than 1.8 wt %, less than 1.6 wt %, less than 1.4 wt %, or less than 1.0 wt % of a Type C glass system, where wt % is based on the total weight of the metallization paste. A metallization paste provided by the present disclosure can comprise, for example, from 0.1 wt % to 2 wt % of a Type C glass system, from 0.2 wt % to 3 wt %, from 0.3 wt % to 2.5 wt %, or from 0.5 wt % to 1.5 wt % of a Type C glass system, where wt % is based on the total weight of the metallization paste.

A metallization paste provided by the present disclosure can have good wettability to a transparent conductor such as a TCO film. Good wettability refers to a metallization paste having a contact angle of less than 30° on a transparent conductor such as a TCO film when heated above the flow point temperature. The metallization paste can flow to contact the interface due to capillary action resulting in good adhesion between the cured metallization paste and the transparent conductor such as a TCO film.

A metallization paste provided by the present disclosure can be cured at a temperature, for example, from 350° C. to 500° C., such as from 400° C. to 450° C., or from 375° C. to 425° C., for a duration from 5 minutes to 90 minutes, such as from 10 minutes to 60 minutes, or from 20 minutes to 40 minutes. The organic materials in a metallization paste provided by the present disclosure can burn off when the metallization paste is cured at a temperature, for example, less than or equal to 350° C., less than 300° C., less than 250° C., or less than 200° C. A metallization paste provided by the present disclosure can be cured without etching or damaging an underlying transparent conductor.

Metallization pastes provided by the present disclosure can include electrically conductive particles such as Ag particles, a glass system provided by the present disclosure, and an organic vehicle. An organic vehicle can contain an organic binder, an organic solvent, a dispersant, and one or more additives such as a rheological modifier. The inorganic component of a metallization paste can comprise a glass system provided by the present disclosure and an electrically conductive metal.

A metallization paste can contain, for example, less than 12 wt % of an organic vehicle, less than 10 wt %, less than 8 wt %, less than 6 wt %, or less than 4 wt % of an organic vehicle, where wt % is based on the total weight of the metallization paste. A metallization paste can contain, for example, from 1 wt % to 12 wt % of an organic vehicle, from 2 wt % to 11 wt %, from 3 wt % to 10 wt %, or from 4 wt % to 8 wt % of an organic vehicle, where wt % is based on the total weight of the metallization paste. An organic vehicle can contain, for example, from 1 wt % to 25 wt % of an organic binder, such as from 5 wt % to 20 wt %, or from 10 wt % to 15 wt % of an organic binder, where wt % is based on the total weight of the organic vehicle. An organic vehicle can contain, for example, from 1 wt % to 85 wt % solvent, such as from 10 wt % to 75 wt %, or from 20 wt % to 65 wt % solvent, where wt % is based on the total weight of the organic vehicle.

A metallization paste provided by the present disclosure can contain, for example, greater than 90 wt % of electrically conductive particles, less than 1.9 wt % of a glass system provided by the present disclosure, and less than 10 wt % of an organic vehicle, where wt % is based on the total weight of the metallization paste.

A metallization paste provided by the present disclosure can contain, for example, from 90 wt % to 99 wt % of electrically conductive particles, from 0.1 wt % to 1.9 wt % of a glass system provided by the present disclosure, and from 0.5 wt % to 10 wt % of an organic vehicle, where wt % is based on the total weight of the metallization paste.

A metallization paste provided by the present disclosure can contain, for example, from 90 wt % to 98 wt % of electrically conductive particles, from 0.5 wt % to 1.5 wt % of a glass system provided by the present disclosure, and from 1 wt % to 8 wt % of an organic vehicle, where wt % is based on the total weight of the metallization paste.

A metallization paste provided by the present disclosure can contain, for example, from 90 wt % to 97 wt % of electrically conductive particles such as silver Ag particles, from 0.7 wt % to 1.2 wt % of a glass system provided by the present disclosure, and from 2 wt % to 7 wt % of an organic vehicle, where wt % is based on the total weight of the metallization paste.

A metallization paste provided by the present disclosure can include silver particles as the primary electrically conductive particles. The silver particles can have an average particle diameter D50, for example, from 0.1 µm to 200 µm, from 1 µm to 150 µm, from 1 µm to 100 µm, from 1 µm to 50 µm, from 1 µm to 30 µm, or from 1 µm to 20 µm. The silver particles can comprise a combination of silver particles with the different silver particles characterized by a different mean particle diameter. The silver particles can be characterized by a distribution of particle diameters.

The electrically conductive particles such as silver particles can have an average particle diameter (D50), for example, from 0.1 µm to about 10 µm, or from 0.5 µm to 5 µm. The average particle diameter may be measured using, for example, using a Horiba LA-960 particle size analyzer after dispersing the conductive silver particles in isopropyl alcohol (IPA) at 25° C. for 3 minutes by ultrasonication. Within this range of average particle diameter, the composition can provide low contact resistance and low line resistance.

The electrically conductive particles such as silver particles may have a spherical, flake or amorphous shape, or a combination of any of the foregoing.

A metallization paste provided by the present disclosure can comprise, for example, from 88 wt % to 99 wt % of electrically conductive particles such as silver Ag particles, from 91 wt % to 98 wt %, from 92 wt % to 97 wt %, or from 93 wt % to 96 wt % of electrically conductive particles such as silver particles, where wt % is based on the total weight of the metallization paste.

A glass system can serve to enhance adhesion between the electrically conductive particles such as silver particles and a transparent conductor.

A metallization paste provided by the present disclosure can comprise electrically conductive metal particles such as silver particles, copper particles, aluminum particles, nickel particles, silver-coated copper particles, or a combination of any of the foregoing.

A metallization paste can also include an organic binder, an organic solvent, an additive, or a combination of any of the foregoing.

A metallization paste provided by the present disclosure can comprise, for example, from 0.05 wt % to 10 wt % of an organic binder; from 1 wt % to 20 wt % of a solvent; and from 0.01 wt % to 1 wt % of one or more additives, where wt % is based on the total weight of the metallization paste.

A metallization paste can comprise an organic binder or combination of organic binders.

An organic binder can be used to impart a desired viscosity and/or rheological property to a metallization paste to facilitate screen printing photovoltaic cell electrodes. The organic binder can also facilitate homogeneous dispersion of the inorganic component within the printable metallization paste.

Suitable organic binders include, for example, acrylate resins and cellulose resins such as ethylcellulose, ethyl hydroxyethylcellulose, nitrocellulose, blends of ethylcellulose and phenol resins, alkyd resins, phenol resins, acrylate esters, xylenes, polybutanes, polyesters, ureas, melamines, vinyl acetate resins, wood rosin, polymethacrylates of alcohols, and combinations of any of the foregoing.

Other suitable resins include, for example, ethyl cellulose, cellulose ester (CAB, CAP), polyacrylate, polysiloxane (modified), polyvinyl butyral (PVB), polyvinyl pyrrolidone (PVP), saturated polyester, non-reactive polyamide (PA), modified polyether, and combinations of any of the foregoing. Other resins characterized by medium polarity may also be used. An organic resin can comprise ethyl cellulose.

An organic binder may be present in an amount, for example, from 0.1 wt % to 10 wt %, from 0.1 wt % to 8 wt %, from 0.2 wt % to 6 wt %, from 0.5 wt % to 5 wt %, or from 0.1 wt % to 5 wt %, where wt % is based on the total weight of the metallization paste.

A metallization paste can comprise an organic solvent or combination of organic solvents.

An organic solvent can be used to impart solubility, dispersion, and/or coupling to the metallization paste.

Examples of suitable organic solvents include terpineol, glycol ether, glycol ether acetate, Texanol® (ester alcohol), tributyl citrate, tributyl O-acetylcitrate, DBE® esters (mixture of dimethyl adipate, dimethyl glutarate and dimethyl succinate); dimethyl phthalate (DMP), and combinations of any of the foregoing. A suitable organic solvent can have, for example, a boiling point greater than 200° C. and an evaporation rate less than 0.01 at 23° C. A suitable organic solvent can be an oxygenated solvent including alcohols such as ethanol, methanol, butanol, n-propyl alcohol, isobutyl alcohol, and isopropyl alcohols; esters such as ethyl acetate, n-butyl acetate, n-propyl acetate, and isopropyl acetate; and ketones such as acetone, diacetone alcohol, isophorone, cyclohexanone, methyl ethyl ketone, and methyl isobutyl ketone. Other suitable organic solvents such as ethers, alcohols, and/or esters may also be used.

In certain embodiments, an organic solvent comprises a glycol ether.

Other examples of suitable solvents include hexane, toluene, ethyl Cellusolve®, cyclohexanone, butyl Cellusolve®, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, ethyl lactate, and combinations of any of the foregoing.

A metallization paste provided by the present disclosure can include from 1 wt % to 20 wt %, from 1 wt % to 10 wt %, from 1 wt % to 6 wt %, or from 1 wt % to 5 wt % of an organic solvent, where wt % is based on the total weight of the metallization paste.

A metallization paste may further include additives to modify the physical properties of the paste such as to enhance flow, process properties, and stability. Additives may include, for example, dispersants, thixotropic agents, plasticizers, viscosity stabilizers, anti-foaming agents, surfactants, pigments, UV stabilizers, antioxidants, coupling agents, and combinations of any of the foregoing.

An additive or combination of additives may be present in the composition in an amount, for example, from 0.005 wt % to about 3 wt %, from 0.1 wt % to 1.5 wt %, from 0.2 wt % to 1.5 wt % or from, 0.3 wt % to 1 wt %, where wt % is based on the total weight of the metallization paste.

A metallization paste provided by the present disclosure can include, for example, from 85 wt % to 97 wt % Ag particles, from 0.1 wt % to 1.9 wt % of glass system provided by the present disclosure, and from 1 wt % to 12 wt % of an organic vehicle, where wt % is based on the total weight of the printable metallization paste.

A metallization paste can include, for example, from 87.5 wt % to 92 wt % Ag particles, from 0.5 wt % to 1.5 wt % of a glass system provided by the present disclosure, and from 2 wt % to 10 wt % of an organic vehicle, where wt % is based on the total weight of the printable metallization paste.

For screen printing fine lines with a high aspect ratio it can be desirable that a metallization paste provided by the present disclosure exhibit a viscosity, for example, from 500 Poise to 7,000 Poise at a temperature from 15° C. to 50° C., as determined using a viscometer with a 10-rpm spindle rotation rate.

A metallization paste provided by the present disclosure can exhibit a viscosity within the range from 50 Pa-sec to 700 Pa-sec, as determined using a Brookfield DV-III+ viscometer with a SC4-14 spindle at 10 rpm and at a temperature of 25° C. A metallization paste provided by the present disclosure can be used to fabricate electrodes having a high aspect ratio. For example, an electrode can be characterized by an aspect ratio, for example, greater than 0.2, greater than 0.3, greater than 0.4, greater than 0.5, greater than 0.6, greater than 0.7, greater than 0.8, greater than 0.9, or greater than 1, where aspect ratio refers to the line height divided by the line width. An electrode can have an aspect ratio, for example, from 0.3 to 1, from 0.4 to 0.8, from 0.4 to 0.6, from 0.5 to 1, or from 0.5 to 0.8.

A metallization paste can be prepared using the following procedure.

A glass system can be prepared by combining the metal oxides to form a metal oxide composition, melting the combined metal oxides to form a glass, quenching the glass, and milling the glass to provide a glass system with a desired mean particle diameter and dispersity.

An organic vehicle can be prepared by mixing and heating a solvent or mixture of solvents and an organic resin or organic resins, plasticizer, defoaming agent, and additives such as rheological thixotropic additive.

Electrically conductive particles such as silver Ag particles can be combined with the organic vehicle, the glass system, and other additives and thoroughly mixed to form a metallization paste.

A metallization paste can then be milled to achieve a desired dispersion of the inorganic components. The metallization paste can then be filtered to remove any undesired large particulates.

A metallization paste can be applied to a surface of a silicon photovoltaic cell by screen printing. Metallization pastes provided by the present disclosure are intended to be applied directly onto a transparent conductor. The screen used in screen printing can be a mesh covered by an emulsion which is patterned to form a grid pattern. The mesh number can be, for example, from 300 mesh to 400 mesh, such as from 325 mesh to 380 mesh and the mesh wire, which can be stainless steel, can have a diameter from about 0.3 mils to 1.5 mils (7.62 μm to 38.1 μm), such as a diameter from 0.7 mils to 1.1 mils (17.78 μm to 27.94 μm). Other screens and mesh sizes can be used as appropriate for a particular metallization paste, process conditions, and desired feature sizes.

A deposited metallization paste in the form of an electrical conductor such as a grid line can have, for example, a width from 0.5 mils to 4 mils (12.7 μm to 101.6 μm), and a height from 0.1 mils to 1.5 mils (2.54 μm to 38.1 μm). A deposited metallization paste can be in the form of a busbar.

After being applied to a surface of a photovoltaic cell, the screen-printed metallization paste can be dried, for example, by heating the applied metallization paste at a temperature from 100° C. to 200° C. for a duration, for example, from 2 minutes to 10 minutes. The dried metallization paste can then be cured, for example, at a temperature less than 500° C., such as from 350° C. to 450° C., for a duration from 5 minutes to 90 minutes, to provide photovoltaic cell electrodes such as gridlines and busbars.

Electrodes having dimensions of 1.2 mm width and 16 μm height can exhibit a line resistivity of less than 3 μΩ-cm and can exhibit an adhesion strength of at least 2 N on a transparent conductor such as a TCO film, where the electrical conductivity is determined according to a line resistivity electrical probe measurement and the adhesion strength is determined according to a 180° solder tab pull test. For context, Ag thick-film busbars having a resistivity less than or equal to 3 μΩ-cm and an adhesion strength greater than 1.5 N are generally considered acceptable for use in the photovoltaic cell industry.

An electrode can be, for example, a busbar or a gridline. A busbar can be solderable. A gridline may not need to be solderable. Therefore, a glass system and a metallization used to form a busbar can have a different composition than that of a gridline.

A photovoltaic cell electrode prepared using a metallization paste provided by the present disclosure can have a line resistivity, for example, less than 3 μΩ-cm, less than 2.75 μΩ-cm, less than 2.5 μΩ-cm, less than 2.2 μΩ-cm, or less than 2.0 μΩ-cm.

A photovoltaic cell electrode prepared using a metallization paste provided by the present disclosure can have a pull strength to a transparent conductor on a silicon wafer substrate, for example, greater than 2 N, greater than 2.5 N, or greater than 3 N, where peel strength is determined according to the 180° angle pull test.

An electrode prepared from a metallization paste provided by the present disclosure can maintain acceptable conductivity and adhesion strength following exposure to accelerated environmental test conditions including damp-heat testing and accelerated thermal cycling, which are used to qualify photovoltaic cells for a 25-year service life.

A metallization paste provided by the present disclosure can be applied to transparent conductors of photovoltaic cells and cured to provide electrical conductors such as gridlines and busbars. Thus, according to the present invention, photovoltaic cells comprise electrodes formed from the metallization pastes provided by the present disclosure. A photovoltaic cell can comprise electrodes formed from a metallization paste comprising a glass system provided by the present disclosure.

Cured electrodes provided by the present disclosure do not contain organic materials. The organic materials in the metallization paste used to form the electrodes are burned off at temperatures, for example, from 150° C. to 380° C. during curing of a metallization paste as the temperature is increased to a curing temperature of from 360° C. to 500° C. For example, a cured electrode provided by the present disclosure can comprise less than 1 wt % organic material, less than 0.1 wt % organic material, or less than 0.01 wt % organic material, where wt % is based on the weight of the electrode. A metallization paste provided by the present disclosure can be applied to a substrate such as a silicon substrate or a transparent conductor on a silicon substrate in the form of an electrode. The metallization paste can then be cured to form an electrode.

An electrode such as a photovoltaic cell electrode can be prepared from a metallization paste provided by the present disclosure.

An electrode such as a photovoltaic cell electrode prepared from a metallizations paste comprising a Type A glass system provided by the present disclosure can comprise, for example, from 0.002 wt % to 0.45 wt % vanadium V, and from 0.02 wt % to 0.9 wt % tellurium Te, where wt % is based on the total weight of the electrode.

An electrode such as a photovoltaic cell electrode prepared from a metallizations paste comprising a Type A glass system provided by the present disclosure can comprise, for example, from 0.002 wt % to 0.45 wt % vanadium V, from 0.005 wt % to 0.4 wt %, or from 0.008 wt % to 0.37 wt % vanadium V, where wt % is based on the total weight of the electrode.

An electrode such as a photovoltaic cell electrode prepared from a metallizations paste comprising a Type A glass system provided by the present disclosure can comprise, for example, from 0.02 wt % to 0.9 wt % tellurium Te, from 0.026 wt % to 0.8 wt %, or from 0.029 wt % to 0.78 wt % tellurium Te, where wt % is based on the total weight of the electrode.

An electrode such as a photovoltaic cell electrode prepared from a metallizations paste comprising a Type A glass system provided by the present disclosure can comprise, for example, from 0.01 wt % to 0.4 wt % vanadium V and from 0.026 wt % to 0.8 wt % tellurium Te, where wt % is based on the total weight of the electrode.

An electrode such as a photovoltaic cell electrode prepared from a metallizations paste comprising a Type A glass system provided by the present disclosure can comprise, for example, from 0.008 wt % to 0.37 wt % vanadium V, and from 0.028 wt % to 0.78 wt % tellurium Te, where wt % is based on the total weight of the electrode.

An electrode such as a photovoltaic cell electrode prepared from a metallizations paste comprising a Type A glass system provided by the present disclosure can comprise, for example, from 0.022 wt % to 1.35 wt % of a combination of vanadium V and tellurium Te, from 0.027 wt % to 1.2 wt %, or from 0.036 wt % to 1.15 wt % of a combination of vanadium V and tellurium Te, where wt % is based on the total weight of the electrode.

An electrode such as a photovoltaic cell electrode prepared from a metallization paste comprising a Type A glass system can comprise, for example, a wt % ratio of tellurium Te to vanadium V from 0.005 to 300, such as from 0.07 to 92, from 0.08 to 75, from 0.09 to 60, from 0.1 to 50, from 0.5 to 20, from 0.5 to 10, from 0.5 to 5, or from 0.5 to 2.5; where wt % is based on the total weight of the electrode.

An electrode such as a photovoltaic cell electrode prepared from a metallization paste comprising a Type B glass system can comprise, for example, from 0.008 wt % to 0.8 wt % vanadium V; from 0.01 wt % to 1.35 wt % lead Pb, and from 0.02 wt % to 0.55 wt % tellurium Te, where wt % is based on the total weight of the electrode.

An electrode such as a photovoltaic cell electrode prepared from a metallization paste comprising a Type B glass system can comprise, for example, from 0.008 wt % to 0.8 wt % vanadium V, from 0.015 wt % to 0.7 wt %, or from 0.02 wt % to 0.55 wt % vanadium V, where wt % is based on the total weight of the electrode.

An electrode such as a photovoltaic cell electrode prepared from a metallization paste comprising a Type B glass system can comprise, for example, from 0.01 wt % to 1.35 wt % lead Pb, from 0.02 wt % to 1.2 wt %, or from 0.03 wt % to 1 wt % lead Pb, where wt % is based on the total weight of the electrode.

An electrode such as a photovoltaic cell electrode prepared from a metallization paste comprising a Type B glass system can comprise, for example, from 0.002 wt % to 0.55 wt % tellurium Te, from 0.01 wt % to 0.45 wt %, or from 0.015 wt % to 0.4 wt % tellurium Te, where wt % is based on the total weight of the electrode.

An electrode such as a photovoltaic cell electrode prepared from a metallization paste comprising a Type B glass system can comprise, for example, from 0.015 wt % to 0.7 wt % vanadium V; from 0.02 wt % to 1.2 wt % lead Pb, and from 0.01 wt % to 0.45 wt % tellurium Te, where wt % is based on the total weight of the electrode.

An electrode such as a photovoltaic cell electrode prepared from a metallization paste comprising a Type B glass system can comprise, for example, from 0.02 wt % to 0.55 wt % vanadium V; from 0.03 wt % to 1 wt % lead Pb, and from 0.015 wt % to 0.4 wt % tellurium Te, where wt % is based on the total weight of the electrode.

An electrode such as a photovoltaic cell electrode prepared from a metallization paste comprising a Type B glass system can comprise, for example, from 0.02 wt % to 2.7 wt % of a combination of vanadium V, lead Pb, and tellurium Te, from 0.05 wt % to 2.35 wt %, or from 0.08 wt % to 1.9 wt % of a combination of vanadium V, lead Pb, and tellurium Te, where wt % is based on the total weight of the electrode.

An electrode such as a photovoltaic cell electrode prepared from a metallization paste comprising a Type B glass system can comprise, for example, a wt % ratio of Te to V from 0.003 to 70, from 0.015 to 30, from 0.03 to 25, from 0.05 to 20, from 0.1 to 10, from 0.1 to 5, or from 0.1 to 2.5, where wt % is based on the total weight of the electrode.

An electrode such as a photovoltaic cell electrode prepared from a metallization paste comprising a Type B glass system can comprise, for example, a wt % ratio of Pb to V from 0.0125 to 170, from 0.3 to 80, from 0.06 to 50, from 0.1 to 25, from 0.1 to 10, or from 0.1 to 4, where wt % is based on the total weight of the electrode.

An electrode such as a photovoltaic cell electrode prepared from a metallization paste comprising a Type B glass system can comprise, for example, from 0 wt % to 0.008 wt % lithium Li, such as from 0.001 wt % to 0.004 wt % lithium Li, where wt % is based on the total weight of the electrode.

An electrode prepared from a metallization paste comprising a Type B glass system can comprise, for example, less than 0.005 wt % lithium, such as less than 0.003 wt % lithium, where wt % is based on the total weight of the electrode.

An electrode prepared from a metallization paste comprising a Type C glass system can comprise, for example, from 0.01 wt % to 0.65 wt % vanadium V, from 0.03 wt % to 1.15 wt % lead Pb, from 0 wt % to 0.2 wt % phosphorous P, and from 0.001 wt % to 0.09 wt % zinc Zn, where wt % is based on the total weight of the electrode.

An electrode prepared from a metallization paste comprising a Type C glass system can comprise, for example, from 0.01 wt % to 0.6 wt % vanadium V, from 0.02 wt % to 0.6 wt %, or from 0.023 wt % to 0.55 wt % vanadium V, where wt % is based on the total weight of the electrode.

An electrode prepared from a metallization paste comprising a Type C glass system can comprise, for example, from 0.03 wt % to 1.2 wt % lead Pb, from 0.035 wt % to 1 wt %, or from 0.04 wt % to 0.9 wt % lead Pb, where wt % is based on the total weight of the electrode.

An electrode prepared from a metallization paste comprising a Type C glass system can comprise, for example, from 0 wt % to 0.2 wt % phosphorous P, from 0.002 wt % to 0.05 wt %, or from 0.004 wt % to 0.03 wt % phosphorous P, where wt % is based on the total weight of the electrode.

An electrode prepared from a metallization paste comprising a Type C glass system can comprise, for example, from 0.0015 wt % to 0.1 wt % zinc Zn, from 0.02 wt % to 0.7 wt %, or from 0.0025 wt % to 0.06 wt % zinc Zn, where wt % is based on the total weight of the electrode.

An electrode prepared from a metallization paste comprising a Type C glass system can comprise, for example, from 0.02 wt % to 0.6 wt % vanadium V, from 0.035 wt % to 1 wt % lead Pb, from 0.002 wt % to 0.05 wt % phosphorous P, and from 0.002 wt % to 0.07 wt % zinc Zn, where wt % is based on the total weight of the electrode.

An electrode prepared from a metallization paste comprising a Type C glass system can comprise, for example, from 0.023 wt % to 0.55 wt % vanadium V, from 0.04 wt % to 0.9 wt % lead Pb, from 0.004 wt % to 0.03 wt % phosphorous P, and from 0.0025 wt % to 0.06 wt % zinc Zn, where wt % is based on the total weight of the electrode.

An electrode prepared from a metallization paste comprising a Type C glass system can comprise, for example, a wt % ratio of phosphorous P to lead Pb from 0 to 0.03, such as from 0.0004 to 0.65, where wt % is based on the total weight of the electrode An electrode prepared from a metallization paste comprising a Type C glass system can comprise, for example, a wt % ratio of zinc Zn to lead Pb from 0.001 to 2.5, such as from 0.002 to 1.65, where wt % is based on the total weight of the electrode.

An electrode prepared from a metallization paste comprising a Type C glass system can comprise, for example, from 0.04 wt % to 2.8 wt % of a combination of vanadium V, lead Pb, phosphorous P, and zinc Zn, such as from 0.0.6 wt % to 1.75 wt %, or from 0.07 wt % to 1.5 wt % of a combination of vanadium V, lead Pb, phosphorous P, and zinc Zn, where wt % is based on the total weight of the electrode.

An electronic device such as a photovoltaic cell provided by the present disclosure can comprise an electrode prepared from a metallization paste comprising a glass system provided by the present disclosure.

A photovoltaic cell can have an electrode such as gridlines, busbars, or other conductive contact layer comprising a cured metallization paste provided the present disclosure.

An electrode can contact a transparent conductor such as a layer of indium tin oxide.

A metallization paste provided by the present disclosure can be applied directly to a transparent conductor and can be cured to form an electrode without damaging the transparent conductor.

An electrode provided by the present disclosure can make electrical contact to a tunnel oxide layer.

Metallization pastes provided by the present disclosure can be used to fabricate electrodes on tunnel oxide passivated contact (TopCon) photovoltaic cells.

A photovoltaic cell provided by the present disclosure can comprise, for example, a doped crystalline silicon substrate, a tunnel oxide layer overlying the doped crystalline silicon substrate, an n+-polysilicon layer overlying the tunnel oxide layer, a transparent conductor overlying the n+-polysilicon layer; and an electrode prepared from a metallization paste provided by the present disclosure contacting the transparent conductor.

A photovoltaic cell provided by the present disclosure can comprise a doped crystalline silicon substrate, a tunnel oxide layer overlying the doped crystalline silicon substrate, a p+-polysilicon layer overlying the tunnel oxide layer, a transparent conductor overlying the p+-polysilicon layer; and an electrode prepared from a metallization paste provided by the present disclosure contacting the transparent conductor. The photovoltaic cell can further comprise a passivation layer, such as an aluminum oxide $Al_2O_3$ passivation layer, overlying the p+-polysilicon layer, and the transparent conductor overlies the passivation layer.

A photovoltaic cell provided by the present disclosure can comprise an n-doped silicon substrate comprising a frontside surface and a backside surface; a tunnel oxide layer overlying the backside surface, wherein the tunnel oxide layer comprises a first portion and a second portion, an n+-polysilicon layer overlying the first portion of the tunnel oxide layer, a p+-polysilicon layer overlying the second portion of the tunnel oxide layer, a first transparent conductor overlying the n+-polysilicon layer, a first electrode grid contacting the first transparent conductor overlying the n+-polysilicon layer, wherein the first electrode grid comprises an electrode prepared from a metallization paste provided by the present disclosure; and a second electrode grid contacting the second transparent conductor overlying the p+-polysilicon layer, wherein the second electrode grid comprises an electrode prepared from a metallization paste provided by the present disclosure.

A photovoltaic cell provided by the present disclosure can comprise a doped silicon substrate having a frontside surface and a backside surface, a doped emitter layer overlying the frontside surface, a passivation layer overlying the doped-emitter layer, an anti-reflective layer overlying the passivation layer, a diffused electrode contacting the doped-emitter layer, a tunnel oxide layer overlying the backside surface, an n+-polysilicon layer overlying the tunnel oxide layer, a transparent conductor overlying the n+-polysilicon layer, and an electrode prepared from a metallization paste provided by the present disclosure contacting the transparent conductor. The doped emitter layer can be, for example, a p+-doped emitter layer or an n+-doped emitter layer. The antireflection layer can comprise silicon nitride $SiN_x$, such as $Si_3N_4$.

FIG. 1 shows an example of a bifacial TopCon/Polo photovoltaic cell. The TopCon/Polo photovoltaic cell shown in FIG. 1 includes an n-type silicon active region 101, tunnel oxide layers 102/103 overlying the textured frontside and backside surfaces of the n-type silicon active region 101. A p+-doped polysilicon layer 104 overlies the frontside tunnel oxide layer 102 and an n+-doped polysilicon layer 105 overlies the backside tunnel oxide layer 103. A frontside transparent conductor 106 overlies the p+-doped polysilicon layer 104 and a backside transparent conductor 107 overlies the n+-doped polysilicon layer. A frontside metallization grid 108 and a backside metallization grid 109 is formed from a metallization paste provided by the present disclosure. The metallization grids are in direct contact with the respective transparent conductors.

FIG. 2 shows an example of a monofacial TopCon/Polo photovoltaic cell in which the backside surface is fully covered by a contact metallization prepared from a metallization paste provided by the present disclosure. The monofacial TopCon/Polo photovoltaic cell shown in FIG. 2 includes an n-type silicon active region 201, tunnel oxide layers 202/203 overlying the textured frontside and backside surfaces of the n-type silicon active region 201. A p+-doped polysilicon layer 204 overlies the frontside tunnel oxide layer 202 and an n+-doped polysilicon layer 205 overlies the backside tunnel oxide layer 203. A frontside transparent conductor 206 overlies the p+-doped polysilicon layer 204 and a backside transparent conductor 207 overlies the n+-doped polysilicon layer. A frontside metallization grid 208 is formed from a metallization paste provided by the present disclosure. A backside metallization layer 209 contacts the backside transparent conductor 207 and covers the backside surface of the photovoltaic cell.

FIG. 3 shows an example of a TopCon/Polo photovoltaic cell that includes a diffused emitter layer (for the p+-polysilicon) and negatively charged passivation layer such as an aluminum oxide passivation layer on the frontside surface of the photovoltaic cell. An aluminum oxide, $Al_2O_3$ passivation layer can have a thickness, for example, from about 1 nm to about 1.2 nm. The TopCon/Polo photovoltaic cell shown in FIG. 3 includes an n-type silicon active region 301, tunnel oxide layers 302/303 overlying the textured frontside and backside surfaces of the n-type silicon active region 301. A p+-doped polysilicon layer 304 overlies the frontside tunnel oxide layer 302 and a n+-doped polysilicon layer 305 overlies the backside tunnel oxide layer 303. A passivation layer 310 overlies the p+-polysilicon layer 304. A frontside transparent conductor 306 overlies the passivation layer 310 and a backside transparent conductor 307 overlies the n+-doped polysilicon layer. A frontside metallization grid 308 is formed from a metallization paste provided by the present disclosure. A backside metallization layer 309 contacts the backside transparent conductor 307 and covers the backside surface of the photovoltaic cell.

Similar to the photovoltaic cell shown in FIG. 2, rather than a metallization grid, the backside of the photovoltaic cell can be covered with a metallization layer.

FIG. 4 shows an example of a photovoltaic cell in which the backside surface has a tunnel oxide passivated contact and the backside surface and a diffused contact on the frontside surface. For example, the photovoltaic cell shown in FIG. 4 includes an n-type crystalline silicon active region 401, a tunnel oxide layer 402 overlying the backside surface of the n-type crystalline silicon region 401, an n+-doped polysilicon layer 403 overlying the tunnel oxide layer 402, and a transparent conductor 404 overlying the n+-doped polysilicon layer 403. Metallization grid 405 formed from a metallization paste provided by the present disclosure contacts the transparent conductor 404. The frontside surface of the photovoltaic cell includes a p+-doped emitter layer 406 overlying the textured surface of the n-type crystalline silicon region 401. For a p-type crystalline silicon active base region the emitter can be an n+-doped emitter layer. A passivating layer 407 such as an $AlO_x$ layer overlies the emitter 406, and an antireflection layer 408 such as an $SiN_x$ layer overlies the passivating layer 406. Frontside contacts 409 etch through the antireflection layer 408 and the passivating layer 407 during firing and make contact to the diffused emitter 406.

Figure 5:
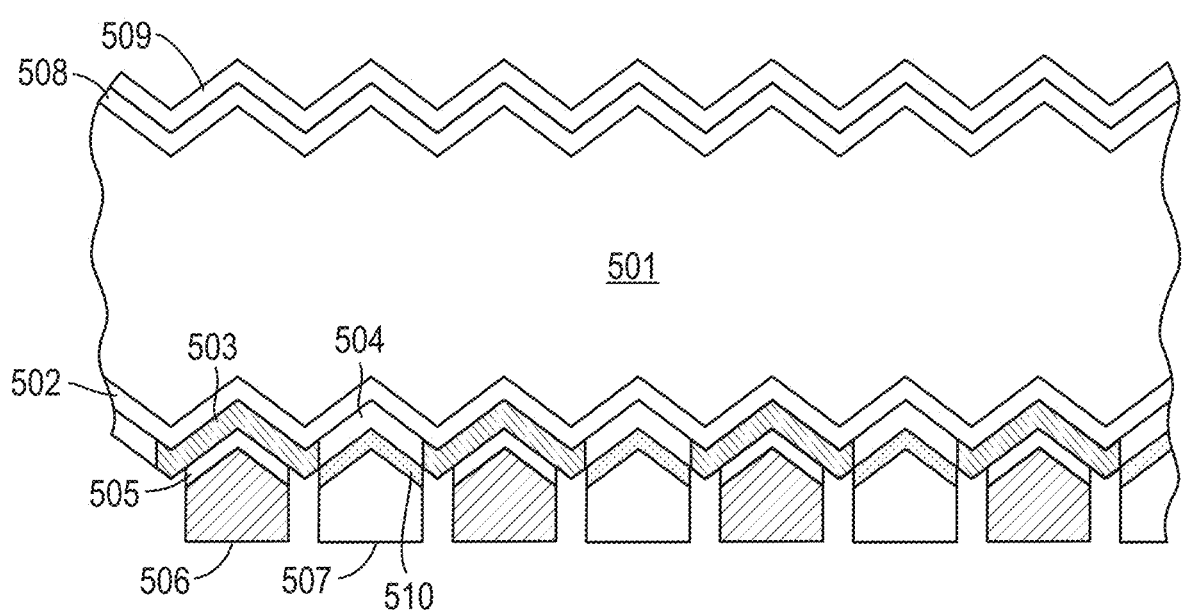
FIG. 5 shows an example of an interdigitated back contact (IBC) photovoltaic cell with positive and negative backside metallization grids provided by the present disclosure.

FIG. 5 shows an interdigitated back contact photovoltaic cell configuration including tunnel oxide passivated contacts. The photovoltaic cell shown in FIG. 5 includes a crystalline silicon active region 501 such as an n-doped silicon layer with textured frontside and backside surfaces. An antireflection layer such as an $SiN_x$ layer 509 and a front-surface doped layer 508 such as an n+-doped layer 508 which acts as a front-surface field overlying the frontside surface of the silicon active region 501. A tunnel oxide layer 502 overlies the textured backside surface. A polysilicon layer having interdigitated p+-doped polysilicon regions 503 and n+-doped polysilicon regions 504 overlie the tunnel oxide layer 502. A first transparent conductor 505 overlies the n+-doped polysilicon regions 504. A second transparent conductor 510 overlies the p+-doped polysilicon regions 503. The first and second transparent conductors 503/504 are electrically isolated from each other. An interdigitated metallization grid including positive electrodes 506 and negative electrodes 507 overlie and contact respective transparent conductors 505 and 510.

Photovoltaic cells having electrodes made from the metallization pastes provided by the present disclosure can be incorporated into photovoltaic modules and photovoltaic systems. The present invention encompasses photovoltaic modules and photovoltaic systems comprising one or more photovoltaic cells comprising a photovoltaic cell electrode provided by the present disclosure, a photovoltaic cell electrode prepared by a method provided by the present disclosure, a photovoltaic cell electrode prepared using a metallization paste provided by the present disclosure, and/or a photovoltaic cell electrode prepared using a glass system provided by the present disclosure.

Devices provided by the present disclosure include devices having a transparent conductor and an electrode provided by the present disclosure interconnected to the transparent conductor. The electrode can be made using a vanadium-containing metallization paste that can be cured at temperatures from 350° C. to 500° C. as provided by the present disclosure. Examples of devices incorporating transparent conductors include photovoltaic devices, touch panels, displays, liquid crystal displays, light emitting diodes including organic light-emitting devices, photodetectors, optoelectronic devices, plasmonic devices, thin film transistors, organic electronic devices, electromagnetic radiation sensors, chemical sensors, and tactile sensors.

EXAMPLES

Embodiments provided by the present disclosure are further illustrated by reference to the following examples, which describe the fabrication and performance of glass system, metallization pastes and photovoltaic cell electrodes according to the present invention. It will be apparent to those skilled in the art that many modifications, both to materials, and methods, may be practiced without departing from the scope of the disclosure.

Example 1

Vanadium-Based Glass System

Type A glass systems were prepared from the metal oxide compositions presented in FIG. 7.

Type B glass systems were prepared from the metal oxide compositions presented in FIG. 8.

Type C glass systems were prepared from the metal oxide compositions presented in FIG. 9.

The source of the metal oxides was Alfa Aesar: vanadium (V) oxide no. 44424, silver (II) oxide no. 40187, tellurium (IV) oxide no., 87813, lead (II) oxide no. 12220, phosphorous (V) oxide no 89966, lithium oxide no. 41832, and zinc oxide no. 87812.

The metal oxides were combined and heated to a temperature from 800° C. to 1,300° C. to melt the oxides. The glass was cooled to room temperature. The glass was then milled to provide a fine glass particle distribution. The glass system was characterized by an average particle size D50 of 2 μm as determined using a Mastersizer 3000 laser diffraction particle-size analyzer (Malvern Panalytical).

The glass transition temperature $T_g$ as determined by differential scanning calorimetry for each of the glass systems is also provided in FIGS. 7-9.

The softening point for the Type A glass systems were from 205° C. to 335° C., for the Type B glass systems from 270° C. to 370° C., and for the Type C glass systems from 290° C. to 395° C., where the softening point was determined by dilatometry and was defined as the temperature at which the glass system began to flow under its own weight.

Example 2

Metallization Paste Containing Vanadium-Based Glass System

Metallization pastes containing the glass system were prepared. The nominal content of the metallization pastes is shown in Table 1.

TABLE 1

Metallization paste.

| Material | Product No. | Source | Content (wt %) |
| --- | --- | --- | --- |
| Ag Particles | AG-4-8 | Dowa Hightech | 90-99 |
| Glass System | See Example 1 | GF1 | 0.1-1.9 |
| Binder | Ethocel ® Ethylcellulose STD4 | Dow Chemical | 0.05-10 |
| Solvent | Glycol ether | Dow Chemical | 1-20 |
| Thixotropic Additive | Thixatrol ® ST | Elementis Co. | 0.5 |
| Dispersant | Disperbyk ® 102 | BYK-chemie | 0.2 |

An organic binder, 1.0 wt % of Ethocel® ethylcellulose (STD4, Dow Chemical Company), was dissolved in 6.69 wt % of glycol ether at 60° C., and 89 wt % of spherical silver particles (AG-4-8, Dowa Hightech Co., Ltd.) having an average particle diameter (D50) of 2.0 μm, 2.5 wt % of a glass system of Example 1 having an average particle diameter (D50) of 1.0 μm, 0.4 wt % of a dispersant (Disperbyk® 102, BYK-Chemie), and 0.4 wt % of a thixotropic agent (Thixatrol® ST, Elementis Co., Ltd.) were added to the binder solution, followed by mixing and kneading in a 3-roll mill, to prepare a screen printable metallization paste. The content of the glass systems for each metallization pastes evaluated is provided in FIGS. 7-9.

The metallization paste was deposited by screen printing in a predetermined pattern over a front surface of a silicon wafer having a transparent conductive oxide (TCO) anti-reflective coating with an underlying doped Si emitter having a sheet resistance of about 45 Ω/sq, followed by drying in an infrared (IR) drying furnace at 150° C. Photovoltaic cells formed according to this procedure were cured at a temperature from 350° C. to 450° C. for a duration from 10 min to 30 min in a belt-type baking furnace.

The metallization paste was also screen printed onto monocrystalline silicon wafers to provide lines that were 40 μm wide and 20 μm high. The metallization paste was then fired at a temperature of about 400° C. for about 20 minutes to provide sintered ohmic contacts for the photovoltaic cell electrode metallization.

Figure 6:
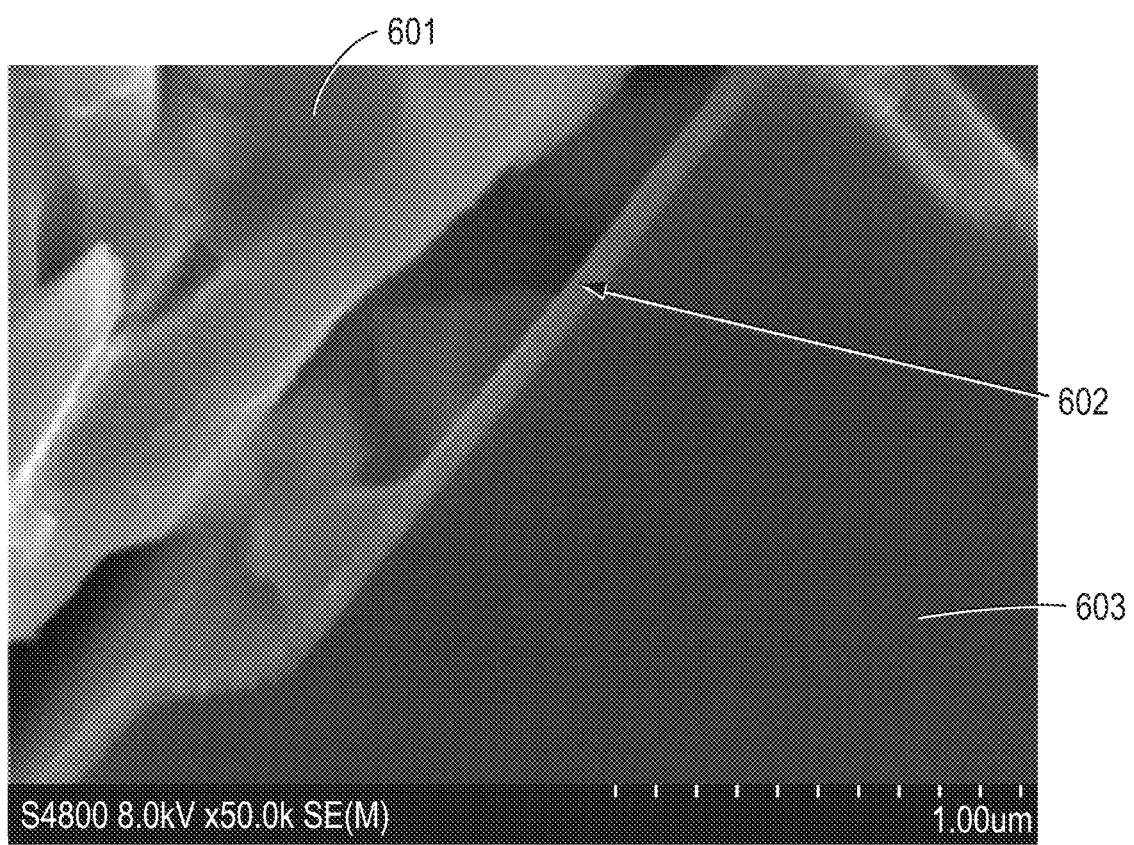
FIG. 6 is a scanning electron microscope (SEM) image showing a cross-section of an interface between a TCO film and an electrode according to the present disclosure.

The resistivity, pull strength, and solderability of the electrodes prepared from the metallization pastes are provided in FIGS. 7-9. Line resistivity was determined according to an ohmmeter and calculated based on the dimensions of the electrode. Pull strength was determined using a Mark-10 pull strength tester where a copper solder-coated ribbon was soldered to the photovoltaic cell busbar and the ribbon was pulled at 180°. Solderability was assessed qualitatively. Poor solderability refers to less than or equal to 30% of the area underneath the tab being soldered. Acceptable solderability refers to 70% to 90% of the electrode top-surface area soldered. Not good solderability refers to less than 70% and greater than 30% of the top-surface area of the electrode soldered. Very good solderability refers to greater than 90% of the top-surface area soldered. The area of the surface soldered can be determined by visual microscopy. Good solderability is also reflected in the failure mode of the pull strength test. When pulled at a force greater than 2N a solder joint should not fail FIG. 6 shows a scanning electron microscope (SEM) image of a TCO film with an overlying electrode fabricated using a metallization paste provided by the present disclosure. FIG. 6 shows a cured metallization paste 601, an indium tin oxide film 602, and a textured silicon surface 603. The indium tin oxide film remains unetched on the silicon surface after the metallization paste is cured.

Aspects of the Invention

The invention is further defined by the following aspects.

Aspect 1. A glass system prepared from a metal oxide composition comprising: from 5 wt % to 35 wt % vanadium pentoxide $V_2O_5$; from 30 wt % to 55 wt % silver oxide $Ag_2O$; and from 30 wt % to 50 wt % tellurium dioxide $TeO_2$; wherein wt % is based on the total weight of the metal oxide composition.

Aspect 2. The glass system of aspect 1, wherein the metal oxide composition comprises from 60 wt % to 85 wt % $Ag_2O$ and $TeO_2$, wherein wt % is based on the total weight of the metal oxide composition.

Aspect 3. The glass system of any one of aspects 1 to 2, wherein the wt % ratio of $TeO_2$ to $V_2O_5$ from 0.8 to 10, wherein wt % is based on the total weight of the metal oxide composition.

Aspect 4. The glass system of any one of aspects 1 to 3, wherein the glass system has a glass transition temperature $T_g$ from 150° C. to 200° C., wherein the glass transition temperature is determined by differential scanning calorimetry.

Aspect 5. The glass system of any one of aspects 1 to 4, wherein the glass system has a softening point from 200° C. to 350° C., wherein the softening point is determined by dilatometry.

Aspect 6. The glass system of any one of aspects 1 to 5, wherein the metal oxide composition further comprises less than 1 wt % tungsten oxide $WO_3$, less than 1 wt % ferrous oxide FeO, or a combination thereof, wherein wt % is based on the total weight of the metal oxide composition.

Aspect 7. The glass system of any one of aspects 1 to 6, wherein the glass system is characterized by an average particle diameter D50 from 0.1 μm to 20 μm.

Aspect 8. The glass system of any one of aspects 1 to 7, wherein the glass system comprises: from 2.5 wt % to 20 wt % vanadium V; from 27 wt % to 52 wt % silver Ag; and from 23 wt % to 40 wt % tellurium Te; wherein wt % is based on the total weight of the metal in the glass system.

Aspect 9. A glass system prepared from a metal oxide composition comprising: from 15 wt % to 65 wt % vanadium pentoxide $V_2O_5$; from 15 wt % to 65 wt % lead oxide PbO; and from 3 wt % to 31 wt % tellurium dioxide $TeO_2$; wherein wt % is based on the total weight of the metal oxide composition.

Aspect 10. The glass system of aspect 9, wherein the metal oxide composition comprises greater than 98 wt % of the $V_2O_5$, PbO, and $TeO_2$, wherein wt % is based on the total weight of the metal oxide composition.

Aspect 11. The glass system of any one of aspects 9 to 10, wherein the metal oxide composition comprises a wt % ratio of $TeO_2$ to $V_2O_5$ from 0.05 to 2, wherein wt % is based on the total weight of the metal oxide composition.

Aspect 12. The glass system of any one of aspects 9 to 11, wherein the metal oxide composition comprises a wt % ratio of PbO to $V_2O_5$ from 0.2 to 4.5, wherein wt % is based on the total weight of the metal oxide composition.

Aspect 13. The glass system of any one of aspects 9 to 12, wherein the glass system has a glass transition temperature $T_g$ from 230° C. to 265° C., wherein the glass transition temperature is determined by differential scanning calorimetry.

Aspect 14. The glass system of any one of aspects 9 to 13, wherein the glass system has a softening point from 250° C. to 400° C., wherein the softening point is determined by dilatometry.

Aspect 15. The glass system of any one of aspects 9 to 14, wherein the metal oxide composition comprises from 0 wt % to 1.5 wt % lithium oxide $Li_2O$, wherein wt % is based on the total weight of the metal oxide composition.

Aspect 16. The glass system of any one of aspects 9 to 15, wherein the metal oxide composition comprises less than 1 wt % tungsten oxide $WO_3$, less than 1 wt % ferrous oxide FeO, or a combination thereof, wherein wt % is based on the total weight of the metal oxide composition.

Aspect 17. The glass system of any one of aspects 9 to 16, wherein the glass system is characterized by an average particle diameter D50 from 0.1 μm to 20 μm.

Aspect 18. The glass system of any one of aspects 9 to 17, wherein the glass system comprises: from 8 wt % to 40 wt % vanadium V; from 12 wt % to 61 wt % lead Pb; and from 2 wt % to 25 wt % tellurium Te; wherein wt % is based on the total weight of metal in the glass system.

Aspect 19. A glass system prepared from a metal oxide composition comprising: from 25 wt % to 50 wt % vanadium pentoxide $V_2O_5$; from 40 wt % to 55 wt % lead oxide PbO; from 0 wt % to 20 wt % phosphorous oxide $P_2O_5$; and from 2 wt % to 5 wt % zinc oxide ZnO; wherein wt % is based on the total weight of the metal oxide composition.

Aspect 20. The glass system of aspect 19, wherein the metal oxide composition comprises a wt % ratio of $P_2O_5$ to PbO from 0 to 0.5, wherein wt % is based on the total weight of the metal oxide composition.

Aspect 21. The glass system of any one of aspects 19 to 20, wherein the metal oxide composition comprises a wt % ratio of ZnO to PbO from 0.035 to 0.125, wherein wt % is based on the total weight of the metal oxide composition.

Aspect 22. The glass system of any one of aspects 19 to 21, wherein the glass system has a glass transition temperature $T_g$ from 260° C. to 285° C., wherein the glass transition temperature is determined by differential scanning calorimetry.

Aspect 23. The glass system of any one of aspects 19 to 22, wherein the glass system has a softening point from 280° C. to 400° C., wherein the softening point is determined by dilatometry.

Aspect 24. The glass system of any one of aspects 19 to 23, wherein the metal oxide composition further comprises less than 1 wt % bismuth oxide $Bi_2O_3$, wherein wt % is based on the total weight of the metal oxide composition.

Aspect 25. The glass system of any one of aspects 19 to 24, wherein the metal oxide composition further comprises less than 1 wt % cuprous oxide $Cu_2O$, wherein wt % is based on the total weight of the metal oxide composition.

Aspect 26. The glass system of any one of aspects 19 to 25, wherein the metal oxide composition comprises less than 1 wt % tungsten oxide $WO_3$, less than 1 wt % ferrous oxide FeO, or a combination thereof, wherein wt % is based on the total weight of the metal oxide composition.

Aspect 27. The glass system of any one of aspects 19 to 26, wherein the glass system is characterized by an average particle diameter D50 from 0.1 μm to 20 μm.

Aspect 28. The glass system of any one of aspects 19 to 27, comprising: from 13 wt % to 30 wt % vanadium V; from 37 wt % to 52 wt % lead Pb; from 0 wt % to 9 wt % phosphorous P; and from 1.6 wt % to 4.1 wt % zinc Zn; wherein wt % is based on the total weight of the glass system.

Aspect 29. A metallization paste comprising: the glass system of any one of aspects 1 to 28; and electrically conductive metal particles.

Aspect 30. The metallization paste of aspect 29, wherein the metallization paste comprises: from 0.1 wt % to 1.9 wt % of the glass system; and greater than 85 wt % of the electrically conductive metal particles, wherein wt % is based on the total weight of the metallization paste.

Aspect 31. The metallization paste of any one of aspects 29 to 30, wherein the metallization paste comprises from 88 wt % to 97 wt % of the electrically conductive metal particles, wherein wt % is based on the total weight of the metallization paste.

Aspect 32. The metallization paste of any one of aspects 29 to 31, wherein the electrically conductive metal particles comprise silver particles.

Aspect 33. The metallization paste of any one of aspects 29 to 32, wherein the electrically conductive particles comprise copper particles, silver-coated copper particles, or a combination thereof.

Aspect 34. The metallization paste of any one of aspects 29 to 33, wherein the electrically conductive metal particles have an average diameter (D50) from 1 μm to 20 μm.

Aspect 35. The metallization paste of any one of aspects 29 to 34, further comprising from 1 wt % to 12 wt % of an organic vehicle, wherein wt % is based on the total weight of the metallization paste.

Aspect 36. The metallization paste of aspect 35, wherein the organic vehicle comprises: from 0.1 wt % to 25 wt % of an organic resin; from 0.01 wt % to 5 wt % of one or more additives; and a solvent, wherein wt % is based on the total weight of the metallization paste.

Aspect 37. The metallization paste of any one of aspects 29 to 36, wherein the metallization paste is curable at a temperature from 350° C. to 500° C. for a duration from 5 minutes to 90 minutes.

Aspect 38. The metallization paste of any one of aspects 29 to 37, wherein the metallization paste does not fire-through a transparent conductive oxide layer having a thickness from 10 nm to 250 nm when exposed to a temperature from 350° C. to 500° C. for a duration from 5 minutes to 90 minutes.

Aspect 39. An electrode comprising the cured metallization paste of any one of aspects 29 to 38.

Aspect 40. The electrode of aspect 39, wherein the electrode comprises: from 0.002 wt % to 0.45 wt % vanadium V; and from 0.02 wt % to 0.9 wt % tellurium Te; wherein wt % is based on the total weight of the electrode.

Aspect 41. The electrode of aspect 39, wherein the electrode comprises: from 0.008 wt % to 0.8 wt % vanadium V; from 0.01 wt % to 1.35 wt % lead Pb; and from 0.002 wt % to 0.55 wt % tellurium Te; wherein wt % is based on the total weight of the electrode.

Aspect 42. The electrode of aspect 39, wherein the electrode comprises: from 0.01 wt % to 0.65 wt % vanadium V; from 0.03 wt % to 1.2 wt % lead Pb; from 0 wt % to 0.2 wt % phosphorous P; and from 0.001 wt % to 0.1 wt % zinc Zn; wherein wt % is based on the total weight of the electrode.

Aspect 43. The electrode of any one of aspects 39 to 42, wherein the electrode exhibits a peel strength to a transparent conductor greater than 2 N, wherein the pull strength is determined using a pull strength tester where a copper solder-coated ribbon was soldered to the electrode and the ribbon was pulled at 180°.

Aspect 44. The electrode of any one of aspects 39 to 42, wherein the electrode exhibits a line resistivity of less than 3 $\mu\Omega$-cm.

Aspect 45. The electrode of any one of aspects 39 to 42, wherein the electrode exhibits a line resistivity of less than 2.5 $\mu\Omega$-cm.

Aspect 46. The electrode of any one of aspects 39 to 45, wherein the electrode is solderable.

Aspect 47. An electronic device comprising the electrode of any one of aspects 39 to 46.

Aspect 48. The electronic device of aspect 47, wherein the electrode contacts a transparent conductor.

Aspect 49. The electronic device of any one of aspects 47 to 48, wherein the electronic device comprises a photovoltaic device, touch panel, display, liquid crystal display, light emitting diode, organic light-emitting device, photodetector, optoelectronic device, plasmonic device, thin film transistor, organic electronic device, electromagnetic radiation sensor, chemical sensor, or tactile sensor.

Aspect 50. The electronic device of any one of aspects 47 to 48, wherein the electronic device comprises a photovoltaic cell.

Aspect 51. The electronic device of aspect 50, wherein the electrode contacts a transparent conductor.

Aspect 52. The electronic device of any one of aspects 50 to 51, wherein the transparent conductor comprises a transparent conductive oxide layer.

Aspect 53. The electronic device of any one of aspects 50 to 52, wherein the photovoltaic cell is a tunnel oxide passivated contact photovoltaic cell.

Aspect 54. The electronic device of any one of aspects 50 to 52, wherein the photovoltaic cell comprises: a doped crystalline silicon substrate; a tunnel oxide layer overlying the doped crystalline silicon substrate; an n+-polysilicon layer overlying the tunnel oxide layer; a transparent conductor overlying the n+-polysilicon layer; and the electrode of any one of aspects 39 to 46 overlying the transparent conductive oxide layer.

Aspect 55. The electronic device of any one of aspects 50 to 52, wherein the photovoltaic cell comprises: a doped crystalline silicon substrate; a tunnel oxide layer overlying the doped crystalline silicon substrate; a p+-polysilicon layer overlying the tunnel oxide layer; a transparent conductor overlying the p+-polysilicon layer; and the electrode of any one of aspects 39 to 46 overlying the transparent conductor.

Aspect 56. The electronic device of aspect 55, further comprising a passivation layer overlying the p+-polysilicon layer, and the transparent conductor overlies the passivation layer.

Aspect 57. The electronic device of aspect 56, wherein the passivation layer comprises $Al_2O_3$.

Aspect 58. The electronic device of any one of aspects 50 to 52, wherein the photovoltaic cell comprises: a doped silicon substrate comprising a frontside surface and a backside surface; a tunnel oxide layer overlying the backside surface of the doped silicon substrate, wherein the tunnel oxide layer comprises a first portion and a second portion; an n+-polysilicon layer overlying the first portion of the tunnel oxide layer; a p+-polysilicon layer overlying the second portion of the tunnel oxide layer; a first transparent conductor overlying the n+-polysilicon layer; a second transparent conductor overlying the p+-polysilicon layer; a first electrode grid contacting the first transparent conductor, wherein the first electrode grid comprises the electrode of any one of aspects 39-46; and a second electrode grid contacting the second transparent conductor, wherein the second electrode grid comprises the electrode of any one of aspects 39-46.

Aspect 59. The electronic device of aspect 58, wherein the doped silicon substrate comprises an n-doped silicon substrate.

Aspect 60. The electronic device of aspect 58, wherein the doped silicon substrate comprises a p-doped silicon substrate.

Aspect 61. The electronic device of aspect 58, further comprising an anti-reflection coating overlying the frontside surface.

Aspect 62. The electronic device of any one of aspects 50 to 52, wherein the photovoltaic cell comprises: a doped silicon substrate having a frontside surface and a backside surface; a doped-emitter layer overlying the frontside surface; a passivation layer overlying the doped emitter layer; an anti-reflective layer overlying the passivation layer; an electrode contacting the doped-emitter layer; a tunnel oxide layer overlying the backside surface; a doped-polysilicon layer overlying the tunnel oxide layer; a transparent conductor overlying the doped-polysilicon layer; and the electrode of any one of aspects 39 to 46 contacting the transparent conductor.

Aspect 63. The electronic device of aspect 62, wherein the doped emitter layer comprises a p+-doped emitter.

Aspect 64. The electronic device of aspect 62, wherein the doped emitter layer comprises an n+-doped emitter layer.

Aspect 65. The electronic device of any one of aspects 62 to 64, wherein the anti-reflection layer comprises $SiN_x$.

Aspect 66. A method of making a glass system, comprising melting a metal oxide composition at a temperature in the range of 800° C. to 1,300° C.

Aspect 67. The method of aspect 66, wherein the metal oxide composition comprises: from 5 wt % to 35 wt % vanadium pentoxide $V_2O_5$; from 30 wt % to 55 wt % silver oxide $Ag_2O$; and from 30 wt % to 50 wt % tellurium dioxide $TeO_2$, wherein wt % is based on the total weight of the metal oxide composition.

Aspect 68. The method of aspect 67, wherein the metal oxide composition comprises from 65 wt % to 85 wt % $Ag_2O$ and $TeO_2$, wherein wt % is based on the total weight of the metal oxide composition.

Aspect 69. The method of any one of aspects 66 to 67, wherein the wt % ratio of $TeO_2$ to $V_2O_5$ from 1.5 to 2.5, wherein wt % is based on the total weight of the metal oxide composition.

Aspect 70. The method of aspect 66, wherein the metal oxide composition comprises: from 15 wt % to 65 wt % vanadium pentoxide $V_2O_5$; from 15 wt % to 65 wt % lead oxide PbO; and from 3 wt % to 31 wt % tellurium dioxide $TeO_2$; wherein wt % is based on the total weight of the metal oxide composition.

Aspect 71. The method of aspect 70, wherein the metal oxide composition comprises greater than 98 wt % of the $V_2O_5$, PbO, and $TeO_2$, wherein wt % is based on the total weight of the metal oxide composition.

Aspect 72. The method of any one of aspects 70 to 71, wherein the wt % ratio of $TeO_2$ to $V_2O_5$ is from 0.05 to 2, wherein wt % is based on the total weight of the metal oxide composition.

Aspect 73. The method of any one of aspects 70 to 72, wherein the wt % ratio of PbO to $V_2O_5$ is from 0.2 to 4.5, wherein wt % is based on the total weight of the metal oxide composition.

Aspect 74. The method of aspect 66, wherein the metal oxide composition comprises: from 25 wt % to 50 wt % vanadium pentoxide $V_2O_5$; from 40 wt % to 55 wt % lead oxide PbO; from 0 wt % to 20 wt % phosphorous oxide $P_2O_5$; and from 2 wt % to 5 wt % zinc oxide ZnO; wherein wt % is based on the total weight of the metal oxide composition.

Aspect 75. The method of aspect 73, wherein the wt % ratio of $P_2O_5$ to PbO is from 0 to 0.05, wherein wt % is based on the total weight of the metal oxide composition.

Aspect 76. The method of any one of aspects 74 to 75, wherein the wt % ratio of ZnO to PbO is from 0.035 to 0.125, wherein wt % is based on the total weight of the metal oxide composition.

Aspect 77. A glass system made by the method of any one of aspects 66 to 76.

Aspect 78. A method of making a metallization paste, comprising combining the glass system of my one of aspects 1 to 28 and 77 and electrically conductive metal particles to form a metallization paste.

Aspect 79. A metallization paste made by the method of aspect 78.

Aspect 80. A method of forming an electrode, comprising: applying the metallization paste of any one of aspects 29-38 and 79 onto a transparent conductor and curing the applied metallization paste to provide an electrode.

Aspect 81. The method of aspect 80, wherein applying comprises screen printing.

Aspect 82. The method of any one of aspects 80 to 81, wherein the transparent conductor has a thickness from 10 nm to 250 nm.

Aspect 83. The method of any one of aspects 80 to 82, wherein curing comprises heating the applied metallization paste to a temperature from 350° C. to 500° C. for a duration from 5 minutes to 90 minutes.

Aspect 84. The method of any one of aspects 81 to 82, wherein the transparent conductor comprises a transparent conductive oxide.

Aspect 85. An electrode made by the method of any one of aspects 80 to 83.

Aspect 86. A photovoltaic module comprising the photovoltaic cell of any one of aspects 50 to 65.

Aspect 87. A photovoltaic system comprising the photovoltaic cell of any one of aspects 50 to 65.

Aspect 1A. An electronic device comprising a vanadium-containing electrode contacting a transparent conductor.

Aspect 2A. The electronic device of aspect 1A, wherein the transparent conductor has a thickness from 10 nm to 250 nm.

Aspect 3A. The electronic device of any one of aspects 1A to 2A, wherein the electrode comprises: from 0.1 wt % to 2.0 wt % of a vanadium-containing glass system; and from 98.0 wt % to 99.9 wt % of an electrically conductive metal, wherein wt % is based on the weight of the electrode.

Aspect 4A. The electronic device of any one of aspects 1A to 3A, wherein the electrically conductive metal comprises silver, copper, aluminum, nickel, or a combination of any of the foregoing.

Aspect 5A. The electronic device of any one of aspects 1A to 4A, wherein the vanadium-containing glass system is prepared from a metal oxide composition comprising: from 15 wt % to 35 wt % vanadium pentoxide $V_2O_5$; from 30 wt % to 55 wt % silver oxide $Ag_2O$; and from 30 wt % to 50 wt % tellurium dioxide $TeO_2$; wherein wt % is based on the total weight of the metal oxide composition.

Aspect 6A. The electronic device of aspect 5A, wherein the wt % ratio of $TeO_2$ to $V_2O_5$ is from 0.8 to 10, wherein wt % is based on the total weight of the metal oxide composition.

Aspect 7A. The electronic device of any one of aspects 5A to 6A, wherein, the glass system has a glass transition temperature $T_g$ from 150° C. to 200° C., wherein the glass transition temperature is determined by differential scanning calorimetry; and the glass system has a softening point from 200° C. to 350° C., wherein the softening point is determined by dilatometry.

Aspect 8A. The electronic device of any one of aspects 1A to 4A, wherein the vanadium-containing glass system is prepared from a metal oxide composition comprising: from 15 wt % to 65 wt % vanadium pentoxide $V_2O_5$; from 15 wt % to 65 wt % lead oxide PbO; and from 3 wt % to 3' wt % tellurium dioxide $TeO_2$; wherein wt % is based on the total weight of the metal oxide composition.

Aspect 9A. The electronic device of aspect 8A, wherein, the metal oxide composition comprises greater than 98 wt % of $V_2O_5$, PbO, and $TeO_2$, wherein wt % is based on the total weight of the metal oxide composition; the metal oxide composition comprises a wt % ratio of $TeO_2$ to $V_2O_5$ from 0.05 to 2, wherein wt % is based on the total weight of the metal oxide composition; and the metal oxide composition comprises a wt % ratio of PbO to $V_2O_5$ from 0.2 to 4.5, wherein wt % is based on the total weight of the metal oxide composition.

Aspect 10A. The electronic device any one of aspects 8A to 9A, wherein, the glass system has a glass transition temperature $T_g$ from 230° C. to 265° C., wherein the glass transition temperature is determined by differential scanning calorimetry; and glass system has a softening point from 250° C. to 400° C., wherein the softening point is determined by dilatometry.

Aspect 11A. The electronic device of any one of aspects 1A to 4A, wherein the vanadium-containing glass system is prepared from a metal oxide composition comprising: from 25 wt % to 50 wt % vanadium pentoxide $V_2O_5$; from 40 wt % to 55 wt % lead oxide PbO; from 0 wt % to 20 wt % phosphorous oxide $P_2O_5$; and from 2 wt % to 5 wt % zinc oxide ZnO; wherein wt % is based on the total weight of the metal oxide composition.

Aspect 12A. The electronic device of aspect 11A, wherein, the metal oxide composition comprises a wt % ratio of $P_2O_5$ to PbO is from 0 to 0.5; and the metal oxide composition comprises a wt % ratio of ZnO to PbO is from 0.035 to 0.125, wherein wt % is based on the total weight of the metal oxide composition.

Aspect 13A. The electronic device of any one of aspects 11A to 12A, wherein, the glass system has a glass transition temperature $T_g$ from 260° C. to 285° C., wherein the glass transition temperature is determined by differential scanning calorimetry; and the glass system has a softening point from 280° C. to 400° C., wherein the softening point is determined by dilatometry.

Aspect 14A. The electronic device of any one of aspects 1A to 13A, wherein the vanadium-containing electrode does not comprise an organic material.

Aspect 15A. The electronic device of any one of aspects 1A to 14A, wherein, the vanadium-containing electrode exhibits a peel strength to the transparent conductor greater than 2 N, wherein the pull strength is determined using a pull strength tester where a copper solder-coated ribbon was soldered to the electrode and the ribbon was pulled at 180°; and the vanadium-containing electrode exhibits a line resistivity of less than 3 µΩ-cm.

Aspect 16A. The electronic device of any one of aspects 1A to 15A, wherein the device comprises a photovoltaic cell.

Aspect 17A. The electronic device of aspect 16A, wherein the photovoltaic cell is a tunnel oxide passivated contact photovoltaic cell.

Aspect 18A. The electronic device of aspect 16A, wherein the photovoltaic cell comprises: doped crystalline silicon substrate; tunnel oxide layer overlying the doped crystalline silicon substrate; an n+-polysilicon layer overlying the tunnel oxide layer; a transparent conductor overlying the n+-polysilicon layer; and a vanadium-containing electrode contacting the transparent conductor.

Aspect 19A. The electronic device of aspect 18A, wherein the photovoltaic cell comprises: a doped crystalline silicon substrate; a tunnel oxide layer overlying the doped crystalline silicon substrate; an p+-polysilicon layer overlying the tunnel oxide layer; a transparent conductor overlying the p+-polysilicon layer; and a vanadium-containing electrode contacting the transparent conductor.

Aspect 20A. The electronic device of any one of aspects 18A to 19A, further comprising a passivation layer overlying the p+-polysilicon layer, and the transparent conductor overlies the passivation layer.

Aspect 21A. The electronic device of aspect 20A, wherein the passivation layer comprises $Al_2O_3$.

Aspect 22A. The electronic device of aspect 16A, wherein the photovoltaic cell comprises: an n-doped crystalline silicon substrate comprising a frontside surface and a backside surface; a tunnel oxide layer overlying the backside surface, wherein the tunnel oxide layer comprises a first portion and a second portion; an n+-polysilicon layer overlying the first portion of the tunnel oxide layer; a p+-polysilicon layer overlying the second portion of the tunnel oxide layer; a first transparent conductor overlying the n+-polysilicon layer; a second transparent conductor overlying the p+-polysilicon layer; a first vanadium-containing electrode grid contacting the first transparent conductor; and a second vanadium-containing electrode grid contacting the second transparent conductor; and optionally a 1-nm thick $Al_2O_3$ passivating layer is present in-between the p+-polysilicon layer and the transparent conductor.

Aspect 23A. The electronic device of aspect 22A, further comprising: an n+-doped silicon layer overlying the frontside surface; and an anti-reflection coating overlying the n+-doped silicon layer.

Aspect 24A. The electronic device of aspect 16A, wherein the photovoltaic cell comprises: a doped silicon substrate having a frontside surface and a backside surface; a doped-emitter layer overlying the frontside surface; a passivation layer overlying the doped-emitter layer; an anti-reflective layer overlying the passivation layer; an electrode contacting the doped-emitter layer; a tunnel oxide layer overlying the backside surface; a doped polysilicon layer overlying the tunnel oxide layer; a transparent conductor overlying the doped polysilicon layer; and a vanadium-containing electrode contacting the transparent conductor.

Aspect 25A. The electronic device of aspect 24A, wherein the doped emitter layer comprises a p+-doped emitter layer or an n+-doped emitter layer.

Aspect 26A. The electronic device of any one of aspects 24A to 25A, wherein the antireflection layer comprises $SiN_x$.

Aspect 27A. The electronic device of any one of aspects 1A to 15A, wherein the electronic device comprises a photovoltaic device, touch panel, display, liquid crystal display, light emitting diode, organic light-emitting device, photodetector, optoelectronic device, plasmonic device, thin film transistor, organic electronic device, electromagnetic radiation sensor, chemical sensor, or tactile sensor.

Aspect 28A. A method of fabricating the electronic device of any one of aspects 1A to 27A, comprising: depositing a vanadium-containing metallization paste onto the transparent conductor; and curing the deposited vanadium-containing metallization paste at a temperature from 350° C. to 500° C., to provide the vanadium-containing electrode.

Aspect 29A. The method of aspect 28A, wherein curing comprises curing at a temperature from 350° C. to 500° C. for from 10 minutes to 90 minutes.

Aspect 30A. The method of any one of aspects 28A to 29A, wherein the vanadium-containing metallization paste comprises: from 0.1 wt % to 2 wt % of the vanadium-containing glass system; and greater than 85 wt % of electrically conductive metal particles, wherein wt % is based on the total weight of the metallization paste.

It should be noted that there are alternative ways of implementing the embodiments disclosed herein. Accordingly, the present embodiments are to be considered as illustrative and not restrictive. Furthermore, the claims are not to be limited to the details given herein and are entitled their full scope and equivalents thereof.

What is claimed is:

1. An electronic device comprising:
a vanadium-containing electrode interconnected directly to a transparent conductive oxide layer, wherein the vanadium-containing electrode comprises:
from 0.1 wt % to 2 wt % of a vanadium-containing glass system; and
from 98.0 wt % to 99.9 wt % of silver Ag,
wherein wt % is based on the weight of the vanadium-containing electrode, and
wherein the vanadium-containing glass system is prepared from a metal oxide composition comprising:
from 20 wt % to 30 wt % of vanadium pentoxide $V_2O_5$;
from 50 wt % to 65 wt % of lead oxide PbO;
from 10 wt % to 25 wt % of tellurium dioxide $TeO_2$; and
from 0.3 wt % to 1.0 wt % of lithium oxide $Li_2O$;
wherein wt % is based on the weight of the metal oxide composition.

2. The electronic device of claim 1, wherein the metal oxide composition comprises a wt % ratio of $TeO_2/V_2O_5$ from 0.1 to 1.0.

3. The electronic device of claim 1, wherein the metal oxide composition comprises a wt % ratio of PbO to $V_2O_5$ from 0.4 to 2.5.

4. The electronic device of claim 1, wherein the transparent conductive oxide layer has a thickness from 10 nm to 250 nm.

5. The electronic device of claim 1, wherein the vanadium-containing electrode comprises copper, aluminum, nickel, or a combination of any of the foregoing.

6. The electronic device of claim 1, wherein,
the vanadium-containing glass system has a glass transition temperature $T_g$ from 230° C. to 260° C., wherein the glass transition temperature is determined by differential scanning calorimetry; and
the vanadium-containing glass system has a softening point from 250° C. to 400° C., wherein the softening point is determined by dilatometry.

7. The electronic device of claim 1, wherein the vanadium-containing electrode does not comprise an organic material.

8. The electronic device of claim 1, wherein,
the vanadium-containing electrode exhibits a peel strength to the transparent conductive oxide layer greater than 2 N, wherein the pull strength is determined using a pull strength tester where a copper solder-coated ribbon is soldered to the electrode and the ribbon is pulled at 180°; and
the vanadium-containing electrode exhibits a line resistivity of less than 3 μΩ-cm.

9. The electronic device of claim 1, wherein the transparent conductive oxide layer is an indium tin oxide layer.

10. The electronic device of claim 1, wherein the vanadium-containing electrode comprises less than 1.6 wt % of the vanadium-containing glass system, wherein wt % is based on the total weight of the vanadium-containing electrode.

11. The electronic device of claim 1, wherein the electronic device comprises a touch panel, display, liquid crystal display, light emitting diode, organic light-emitting device, photodetector, optoelectronic device, plasmonic device, thin film transistor, organic electronic device, electromagnetic radiation sensor, chemical sensor, or tactile sensor.

12. The electronic device of claim 1, wherein the vanadium-containing glass system comprises:
25.1 wt % of vanadium pentoxide $V_2O_5$;
57.8 wt % of lead oxide PbO;
16.5 wt % of tellurium dioxide $TeO_2$; and
0.51 wt % of lithium oxide $Li_2O$,
wherein wt % is based on the weight of the metal oxide composition.

13. The electronic device of claim 1, wherein the electronic device comprises a photovoltaic cell.

14. The electronic device of claim 13, wherein the photovoltaic cell is a tunnel oxide passivated contact photovoltaic cell.

15. The electronic device of claim 13, wherein the photovoltaic cell comprises:
a doped crystalline silicon substrate;
a tunnel oxide layer overlying the doped crystalline silicon substrate;
an n+-polysilicon layer overlying the tunnel oxide layer; and
the transparent conductive oxide layer overlies the n+-polysilicon layer.

16. The electronic device of claim 13, wherein the photovoltaic cell comprises:
a doped crystalline silicon substrate;
a tunnel oxide layer overlying the doped crystalline silicon substrate;
a p+-polysilicon layer overlying the tunnel oxide layer; and
the transparent conductive oxide layer overlies the p+-polysilicon layer.

17. The electronic device of claim 16, further comprising a passivation layer overlying the p+-polysilicon layer, and the transparent conductive oxide layer overlies the passivation layer.

18. The electronic device of claim 17, wherein the passivation layer comprises $Al_2O_3$.

19. The electronic device of claim 13, wherein the photovoltaic cell comprises:
an n-doped silicon substrate comprising a frontside surface and a backside surface;
an antireflection coating overlying the frontside surface;
a tunnel oxide layer overlying the backside surface, wherein the tunnel oxide layer comprises a first portion and a second portion;
an n+-polysilicon layer overlying the first portion of the tunnel oxide layer;
a p+-polysilicon layer overlying the second portion of the tunnel oxide layer;
wherein the transparent conductive oxide layer comprises a first transparent conductive oxide layer and a second transparent conductive oxide layer, wherein:
the first transparent conductive oxide layer overlies the n+-polysilicon layer; and
the second transparent conductive oxide layer overlies the p+-polysilicon layer; and
wherein the vanadium-containing electrode comprises a first vanadium-containing electrode grid and a second vanadium-containing electrode grid, wherein:
the first vanadium-containing electrode grid contacts the first transparent conductive oxide layer; and the second vanadium-containing electrode grid contacts the second transparent conductive oxide layer.

20. The electronic device of claim 13, wherein the photovoltaic cell comprises:
a doped silicon substrate having a frontside surface and a backside surface;
a doped emitter layer overlying the frontside surface;
a passivation layer overlying the doped-emitter layer;
an antireflection layer overlying the passivation layer;
an electrode contacting the doped-emitter layer;
a tunnel oxide layer overlying the backside surface;
a doped polysilicon layer overlying the tunnel oxide layer; and
the transparent conductive oxide layer overlies the doped polysilicon layer.

21. The electronic device of claim 20, wherein the doped emitter layer comprises a p+-doped emitter layer and the antireflection layer comprises $SiN_x$.

22. A method of fabricating the electronic device of claim 1, comprising:
depositing the vanadium-containing metallization paste onto the transparent conductive oxide layer; and
curing the deposited vanadium-containing metallization paste at a maximum temperature from 350° C. to 500° C., to provide the vanadium-containing electrode.

23. The method of claim 22, wherein curing comprises exposing the deposited vanadium-containing metallization paste to a maximum temperature from 350° C. to 500° C. for from 5 minutes to 90 minutes.

24. The method of claim 22, wherein the vanadium-containing metallization paste comprises:
less than 1.6 wt % of the vanadium-containing glass system; and
greater than 85 wt % of silver Ag,
wherein wt % is based on the total weight of the metallization paste.

* * * * *